United States Patent
Matano

[19]

[11] Patent Number: 6,002,635
[45] Date of Patent: Dec. 14, 1999

[54] SEMICONDUCTOR MEMORY DEVICE WITH CONTROL FOR AUXILIARY WORD LINES FOR MEMORY CELL SELECTION

[75] Inventor: Tatsuya Matano, Tokyo, Japan

[73] Assignee: NEC Corporation, Tokyo, Japan

[21] Appl. No.: 09/144,939

[22] Filed: Sep. 1, 1998

[30] Foreign Application Priority Data

Sep. 3, 1997 [JP] Japan ...................................... 9-238474

[51] Int. Cl.⁶ .................................................. G11C 7/00
[52] U.S. Cl. ........................ 365/230.06; 365/230.03; 365/189.09
[58] Field of Search .................... 365/230.06, 230.03, 365/189.09, 189.17

[56] References Cited

U.S. PATENT DOCUMENTS 5,808,955  9/1998  Hwang et al. ..................... 365/230.06

FOREIGN PATENT DOCUMENTS

| 4302896 | 10/1992 | Japan | G11C 11/407 |
| 684355 | 3/1994 | Japan | G11C 11/407 |
| 6309867 | 11/1994 | Japan | G11C 11/401 |

OTHER PUBLICATIONS

"Circuit Design Techniques for Low–Voltage Operating and/or Giga–Scale DRAMs" Yamagata et al ISSCC95; Feb. 17, 1995; p. 248–249.

*Primary Examiner*—Vu A. Le
*Attorney, Agent, or Firm*—Hayes Soloway Hennessey Grossman & Hage PC

[57] ABSTRACT

A semiconductor memory device has a main row decoder for controlling a main word line, an auxiliary row decoder for controlling auxiliary word lines, and auxiliary word line drive circuits controllable by the main word line and the auxiliary word selecting lines, for controlling auxiliary word lines to select memory cells. The semiconductor memory device incorporates a hierarchical word line system where word lines do not need to be lined with metallized interconnections. The main word line and the auxiliary word selecting lines control the auxiliary word line drive circuits to supply an arbitrary negative voltage generated by a negative potential generator to an auxiliary word line in an unselected state, and to keep only a selected auxiliary word line at a high level in a selected state.

30 Claims, 18 Drawing Sheets

SEMICONDUCTOR MEMORY DEVICE WITH CONTROL FOR AUXILIARY WORD LINES FOR MEMORY CELL SELECTION

BACKGROUND OF THE INVENTION

1. Field of the Invention

The present invention relates to a semiconductor memory device, and more particularly to a semiconductor memory device having an auxiliary word line drive circuit for activating auxiliary word lines for memory cell selection according to a main word line controlled by a main decoder circuit and auxiliary word selecting lines controlled by an auxiliary decoder circuit.

2. Description of the Related Art

In recent years, semiconductor memory devices have been highly integrated for increased storage capacities at growing rates due to advances in the semiconductor microfabrication technology. Of the semiconductor memory devices, dynamic random-access memories (DRAM) capable of storing and holding data can easily be highly integrated for increased storage capacities because one memory cell comprises two components, i.e., a transistor and a capacitor. DRAMs having a storage capacity of gigabit have already been proposed in publications from related academic societies.

FIG. 1 of the accompanying drawings shows a DRAM memory cell. As shown in FIG. 1, the DRAM memory cell has a memory cell capacitor C1 which is kept at a power supply voltage Vcc through a memory cell transistor M1 or a ground potential GND. A threshold voltage Vtn of the memory cell transistor M1 is higher than threshold voltages of surrounding transistors for reducing a subthreshold leakage. For writing data into the memory cell capacitor C1, therefore, it is necessary to apply a voltage higher than the sum of the threshold voltage Vtn and the power supply voltage Vcc to a word line WL to which the memory cell transistor M1 is connected. As a result, an increased potential Vpp higher than the power supply voltage Vcc is applied through the word line WL to the gate of the memory cell transistor M1.

As the storage capacities of DRAMs increase, the power supply voltage supplied from an external source to the DRAMs decreases. For example, the power supply voltage for a DRAM having a storage capacity of 64,256 Mb is about 3.3 V, and the power supply voltage for a DRAM having a storage capacity of 1 Gb is about 2.5 V.

For high-speed operation of DRAMs with lowered power supply voltages, the threshold voltages of the memory cell transistors may be lowered to increase their driving capabilities. However, the lowered threshold voltages are responsible for poor subthreshold leakage characteristics.

The threshold voltages of memory cell transistors cannot be substantially lowered because of the need to reduce the subthreshold leakage, and cannot be scaled with respect to the power supply voltage. Accordingly, the increased voltage applied to the gate of the memory cell transistor cannot sufficiently be lowered, and it is difficult to obtain the increased voltage from the power supply voltage which is lowered.

For solving the above problems, it has been proposed to apply a negative voltage to a word line connected to a memory cell.

FIG. 2 of the accompanying drawings shows a first conventional semiconductor memory device (Japanese laid-open patent publication No. 84355/94) according to such a proposal, and FIG. 3 of the accompanying drawings shows a timing chart of operation of the first conventional semiconductor memory device.

In FIG. 2, word lines WL0, WL1 serve to carry signals to be applied to the gates of memory cell transistors M49.

In an unselected state, the gates of selecting transistors N66 in a word decoder 52 are kept at a ground potential GND, rendering the selecting transistors N66 nonconductive, and the gates of non-selecting transistors N68 are kept at a power supply potential Vcc, rendering the non-selecting transistors N68 conductive. Word line selecting signals 50a from a low-order address predecoder 53 have the ground potential GND. The word lines WL0, WL1 are kept at a negative potential VL which is of a low level, the negative potential VL being of a value smaller than the absolute value of a threshold voltage Vtn of the n-channel transistors N66.

In a selected state, in the word decoder 52, an address signal is applied at a time t1 to change the output signal from an NAND gate 60 to change from the Vcc potential to the negative potential VL. The gate potential of the transistors N66 changes to Vcc-Vtn, rendering the transistors N66 conductive, and the gate potential of the transistors N68 changes to the negative potential VL, rendering the transistors N68 nonconductive.

Therefore, all the word lines connected to the conducted transistors N66 are elevated from the negative potential VL to the ground potential GND.

In the low-order address predecoder 53, the potential of only a selected one of the word line selecting signals 50a changes to an increased potential VH in response to the applied address signal, thereby elevating a desired word line WL0 to the increased potential VH.

FIG. 4 shows a second conventional semiconductor memory device (Yamagata, T., et al., "Circuit Design Techniques for Low-Voltage Operating and/or Giga-Scale DRAMs", ISSCC Digest of Technical Papers, pp. 248–249, February, 1955).

In an unselected state, the output signal from a NAND gate 71 has a power supply potential Vcc. Therefore, the gate of a transistor N72 is kept at the power supply potential Vcc, rendering the transistor N72 conductive. An increased potential Vpp is applied to the gate of a transistor P72, which is rendered nonconductive. A word line WL is now kept at a negative potential Vbb.

When an address signal is applied to bring about a selected state, the output signal from the NAND gate 71 has a ground potential GND. The gate of the transistor N72 is kept at the negative potential Vbb, rendering the transistor N72 nonconductive. A ground potential GND is applied to the gate of the transistor P72, which is rendered conductive. The potential of the word line WL changes from the negative potential Vbb to the increased potential Vpp.

The above conventional semiconductor memory devices are disadvantageous for the following reasons:

According to the first conventional semiconductor memory device, the negative potential is set to an absolute value lower than the threshold voltage of the n-channel transistors, making it impossible to sufficiently lower the word line potential. Furthermore, when the word decoder 52 is activated, those word lines which are not selected by the word line selecting signals 50 change from the negative potential to the ground potential GND.

According to the second conventional semiconductor memory device, the negative potential or low level for the word line WL can be selected irrespective of the threshold voltage of the transistors. However, as the semiconductor memory device becomes smaller in size, it becomes difficult to line the word lines with metallized interconnections for reducing interconnection-induced delays at the pitch of the word lines. This drawback holds true for the first conventional semiconductor memory device, and presents obstacles to efforts to reduce the size and increase the storage capacity of semiconductor memory devices.

SUMMARY OF THE PRESENT INVENTION

It is therefore an object of the present invention to provide a semiconductor memory device which has a circuit arrangement suitable for reduced sizes and increased storage capacities, and which is capable of supplying a desired negative voltage to word lines connected to memory cells in an unselected state, and making only a selected word line high in level in a selected state.

According to the present invention, a semiconductor memory device has a main row decoder for controlling a main word line, an auxiliary row decoder for controlling auxiliary word selecting lines, and auxiliary word line drive circuits controllable by the main word line and the auxiliary word selecting lines, for controlling auxiliary word selecting lines to select memory cells. The semiconductor memory device incorporates a hierarchical word line system where word lines do not need to be lined with metallized interconnections. The main word line and the auxiliary word selecting lines control the auxiliary word line drive circuits to supply an arbitrary negative voltage generated by a negative potential generator to an auxiliary word line in an unselected state, and to keep only a selected auxiliary word line at a high level in a selected state.

Since the semiconductor memory device incorporates a hierarchical word line system where word lines do not need to be lined with metallized interconnections, the semiconductor memory device has a circuit arrangement which can be microfabricated in highly reduced sizes and can provide a high storage capacity. In an unselected state, an arbitrary negative voltage is supplied to an auxiliary word line connected to memory cells. In a selected state, only a selected auxiliary word line is rendered high in level.

The above and other objects, features and advantages of the present invention will become apparent from the following description with reference to the accompanying drawings which illustrate examples of the present invention.

BRIEF DESCRIPTION OF THE DRAWINGS

FIGS. 14A, 14B through 22A, 22B are circuit diagrams of different auxiliary word line drive circuits and timing charts of operation thereof.

DESCRIPTION OF THE PREFERRED EMBODIMENTS

Figure 1:
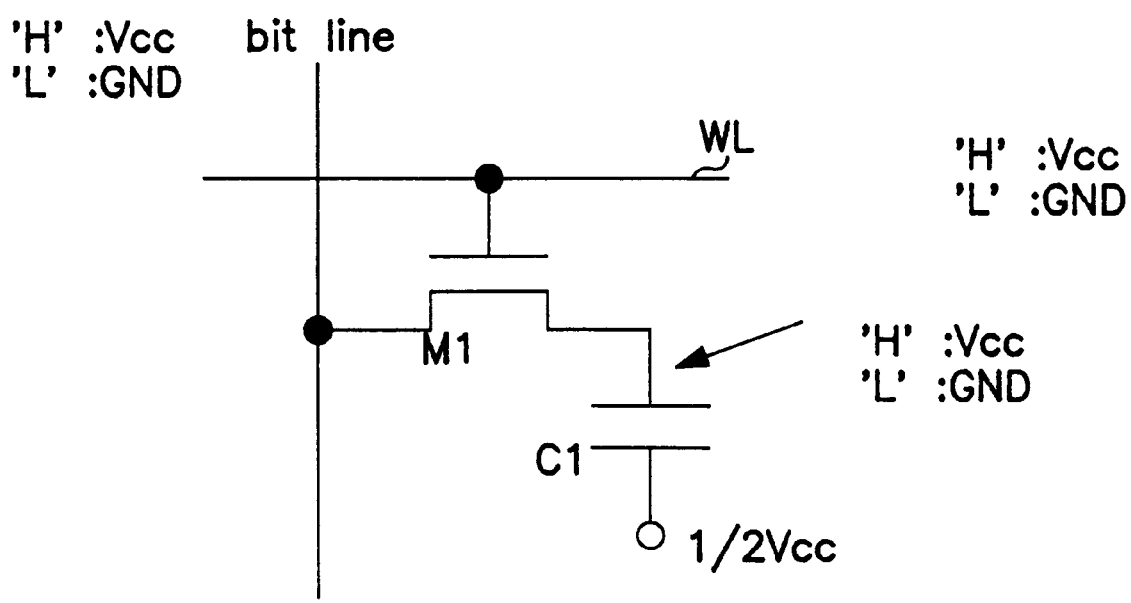
FIG. 1 is a circuit diagram of a DRAM memory cell.
Figure 2:
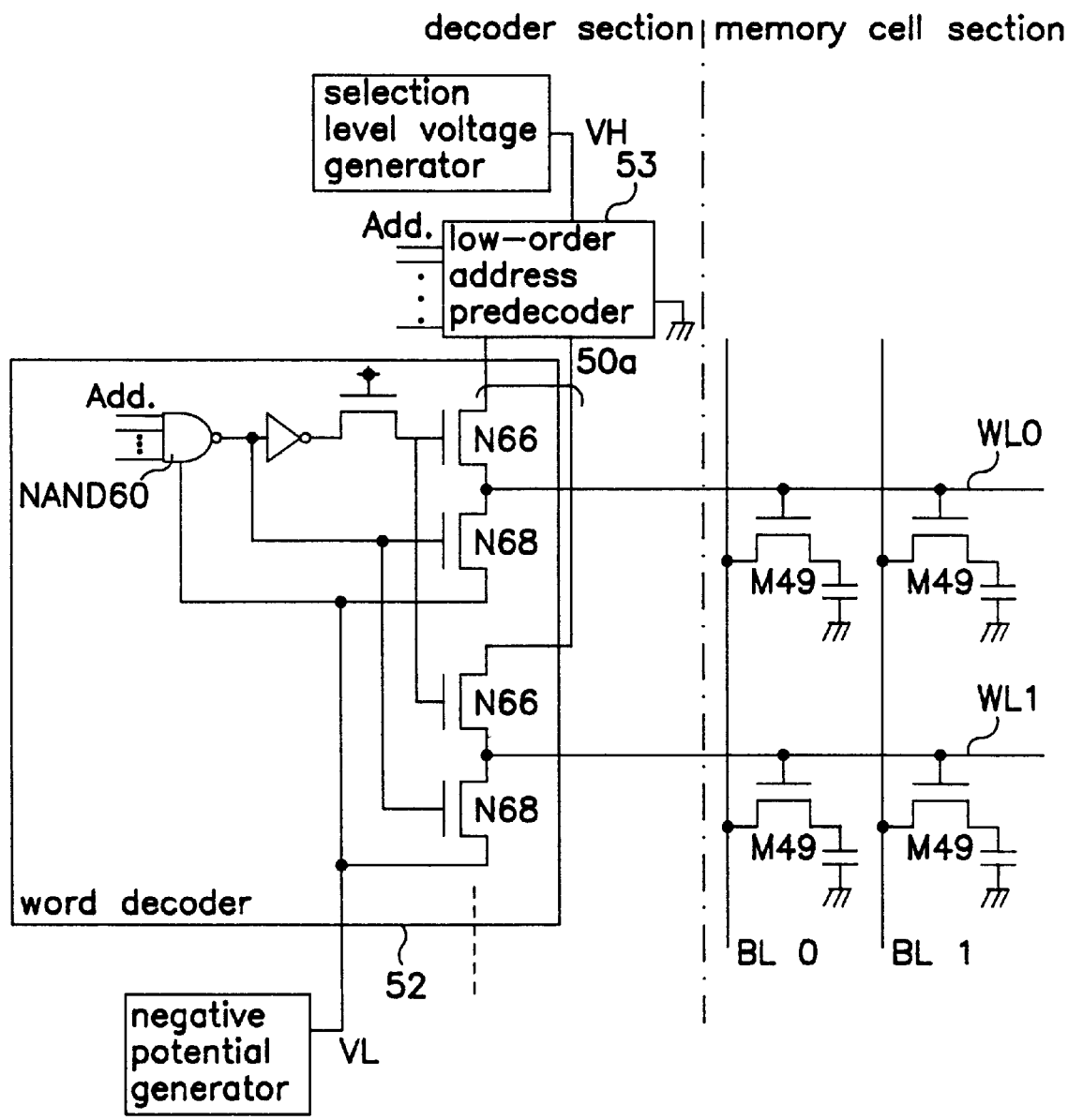
FIG. 2 is a circuit diagram of a first conventional semiconductor memory device.
Figure 3:
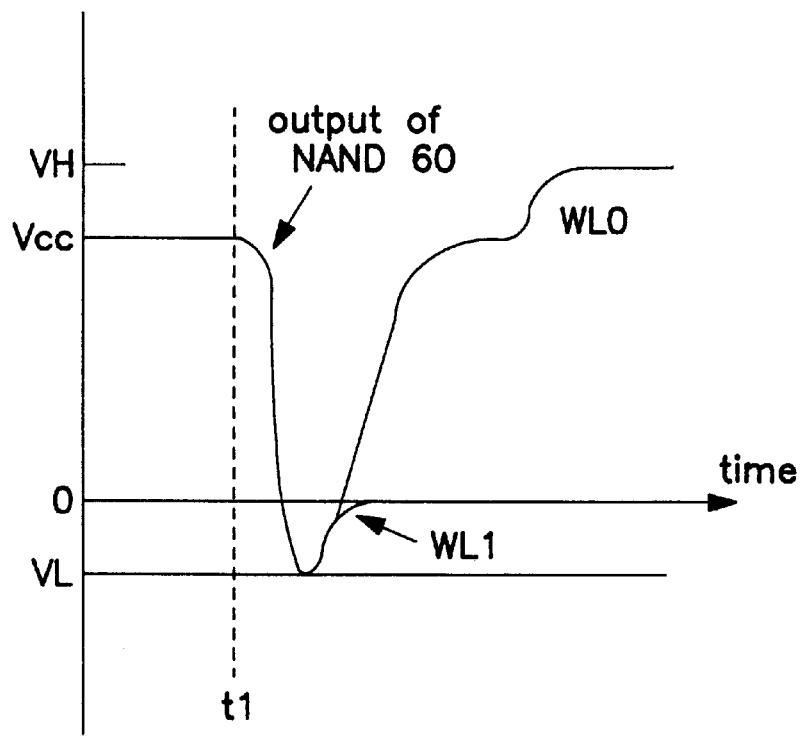
FIG. 3 is a timing chart of operation of the first conventional semiconductor memory device.
Figure 4:
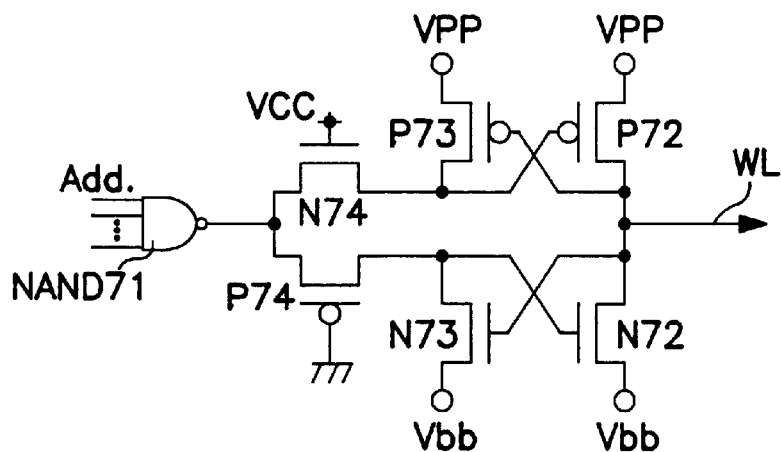
FIG. 4 is a circuit diagram of a second conventional semiconductor memory device.
Figure 5:
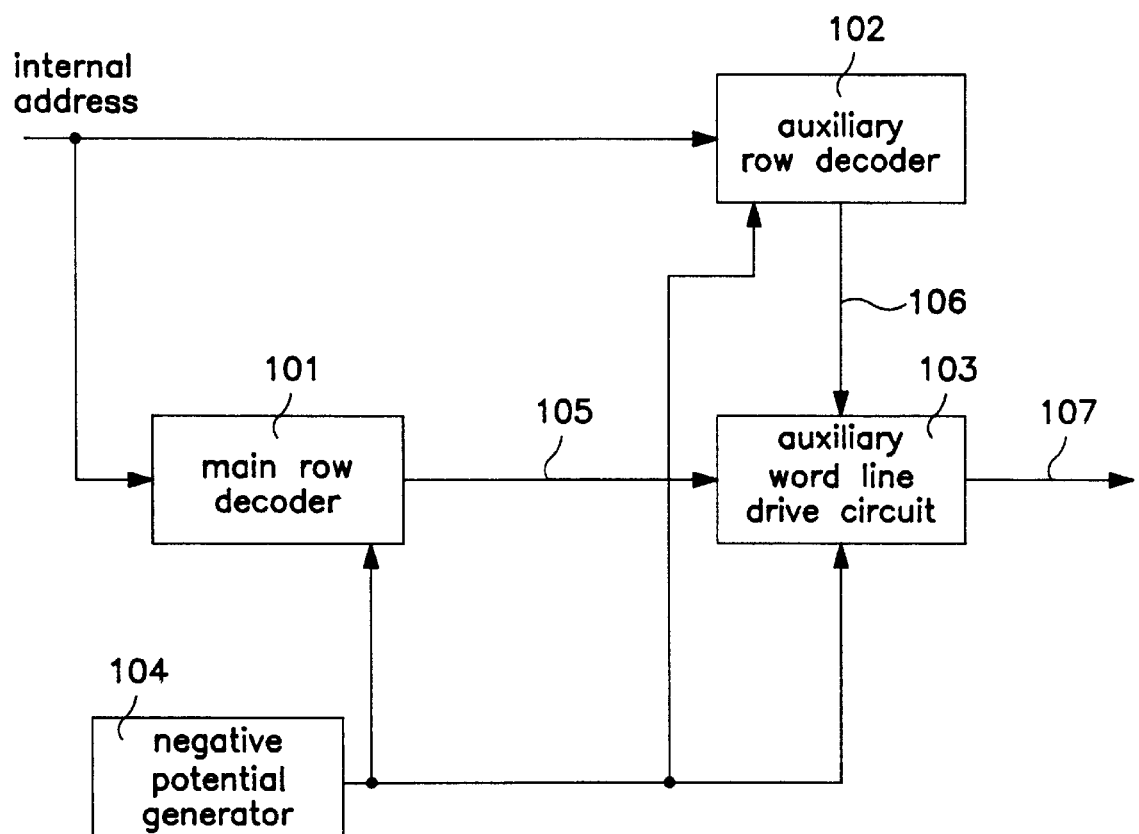
FIG. 5 is a block diagram of a semiconductor memory device according to an embodiment of the present invention.

As shown in FIG. 5, a semiconductor memory device according to an embodiment of the present invention comprises a main row decoder 101, an auxiliary row decoder 102, auxiliary word line drive circuits 103 for activating memory cell selecting auxiliary word lines 107 according to a main word line 105 controlled by the main row decoder 101 and auxiliary word selecting lines 106 controlled by the auxiliary row decoder 102, and a negative potential generator 104 for applying a negative potential to the memory cell selecting auxiliary word lines 107 when the memory cell selecting auxiliary word lines 107 are unselected. According to the present invention, the semiconductor memory device employs a hierarchical word line system.

When an internal address signal is applied, the main row decoder 101 and the auxiliary row decoder 102 are activated to select a desired auxiliary word line drive circuit 103. The memory cell selecting auxiliary word line 107 of the selected auxiliary word line drive circuit 103 goes high in level. The negative potential generated by the negative potential generator 104 is supplied to the main row decoder 101, the auxiliary row decoder 102, and the auxiliary word line drive circuit 103. The memory cell selecting auxiliary word lines 107 of the unselected auxiliary word line drive circuits 103 are kept at the negative potential which is of a low level. The negative potential generator 104 which generates the negative potential may comprise a generally known circuit for generating a low voltage in a semiconductor memory device. For example, the negative potential generator 104 may comprise a charge pump circuit or the like which is controlled by a negative voltage level detector, for supplying a negative potential having a constant level.

Figure 6:
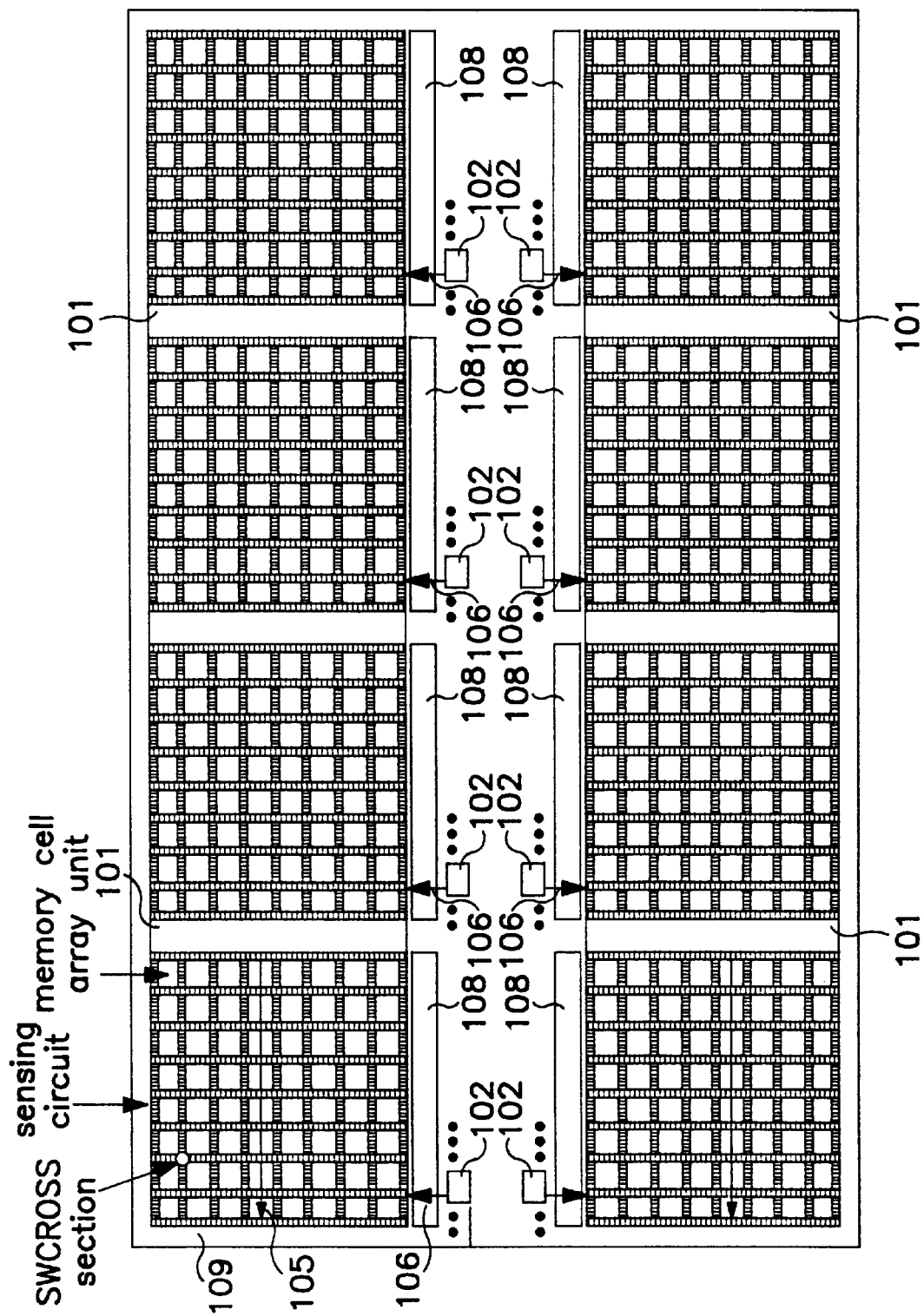
FIG. 6 is a diagram showing the layout of a DRAM which incorporates the semiconductor memory device shown in FIG. 5.

FIG. 6 shows the layout of a DRAM which incorporates the semiconductor memory device shown in FIG. 5.

As shown in FIG. 6, auxiliary row decoders 102 are disposed alongside of column decoders 108. When a main word line 105 of a main row decoder 101 and an auxiliary word selecting line 106 of an auxiliary row decoder 102 are activated, a desired auxiliary word line drive circuit 103 in an auxiliary word line drive circuit array 109 is selected to drive an auxiliary word line 107.

Figure 7:
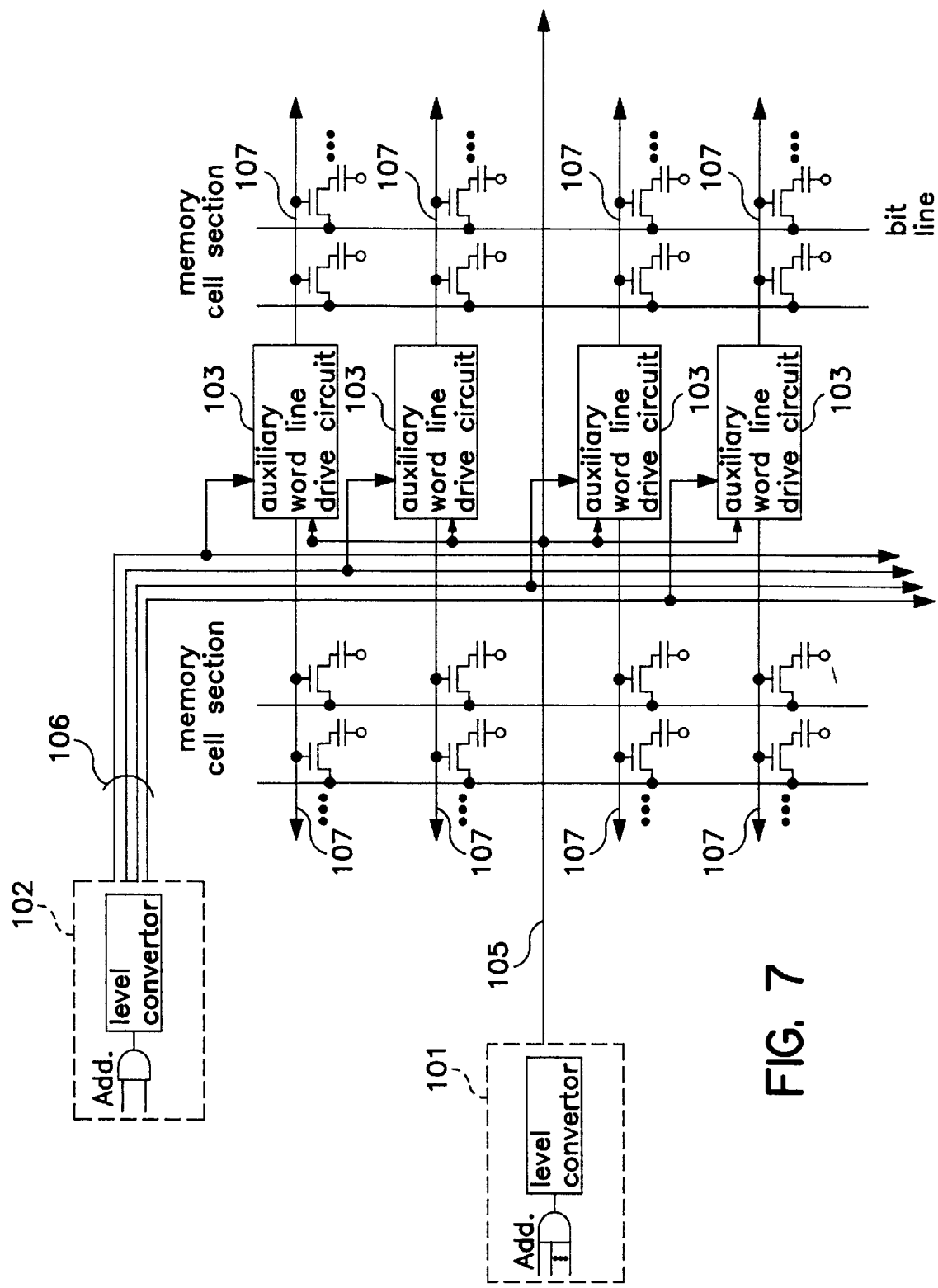
FIG. 7 is a circuit diagram, partly in block form, of the semiconductor memory device according to the embodiment of the present invention.

FIG. 7 shows, partly in block form, the semiconductor memory device in detail.

As shown in FIG. 7, the gates of memory cell transistors in a memory cell array are connected to auxiliary word lines 107 extending from auxiliary word line drive circuits 103. A single main word line 105 extending from a main row decoder 101 is connected to a plurality of (four in this embodiment) auxiliary word line drive circuits 103 in an auxiliary word line drive circuit array 109. One of the auxiliary word line drive circuits 103 is selected by a corresponding one of auxiliary word selecting lines 106 extending from an auxiliary row decoder 102, thereby activating a desired one of the auxiliary word lines 107.

Each of the main row decoder 101 and the auxiliary row decoder 102 includes a level converter which may be any one of circuit arrangements shown in FIGS. 8 through 11 depending on the amplitude of logic levels on the main word line 105 and the auxiliary word selecting lines 106, which serve as input control lines for the auxiliary word line drive circuits 103.

Figure 8:
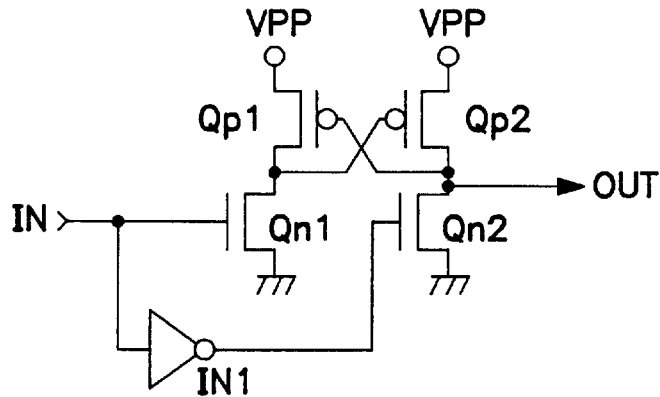
FIGS. 8 through 12 are circuit diagrams of different level converters.

The circuit arrangement shown in FIG. 8 serves to convert an input signal having a power supply potential Vcc as a high level and a ground potential GND as a low level into an output signal having an increased potential Vpp as a high level and a ground potential GND as a low level.

Figure 9:
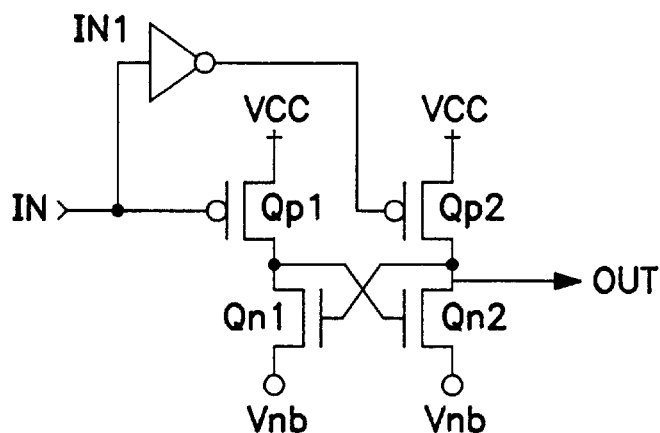

The circuit arrangement shown in FIG. 9 serves to convert an input signal having a power supply potential Vcc as a high level and a ground potential GND as a low level into an output signal having the power supply potential Vcc as a high level and a negative potential Vnb as a low level.

Figure 10:
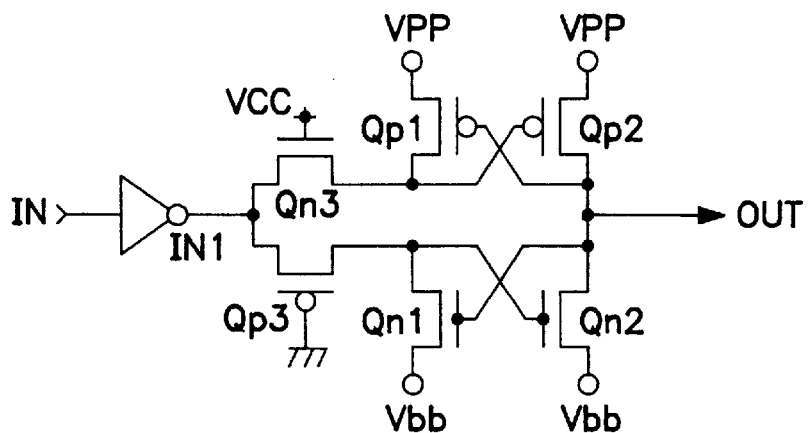
Figure 11:
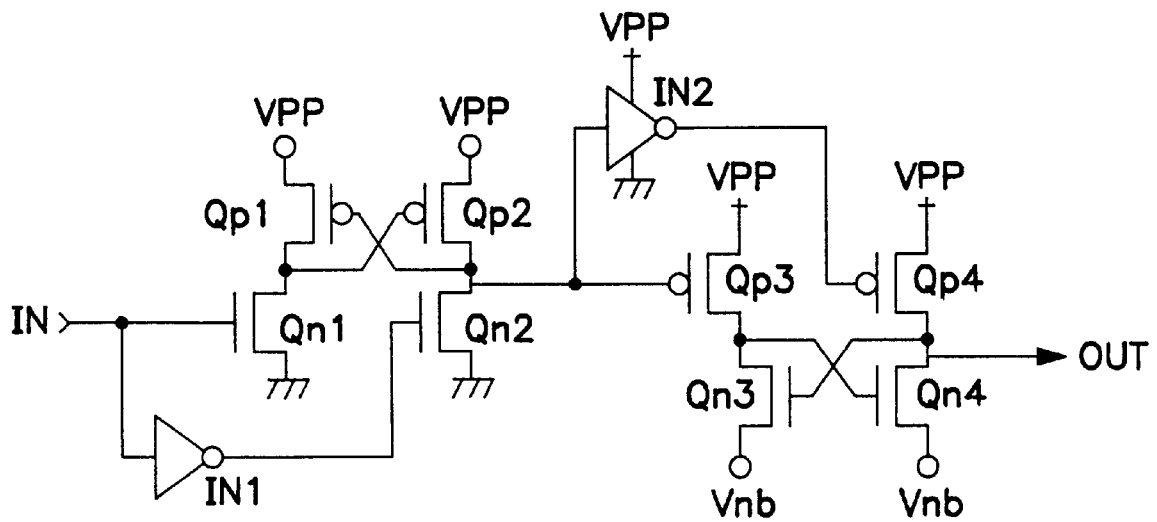

The circuit arrangement shown in FIGS. 10 or 11 serves to convert an input signal having a power supply potential Vcc as a high level and a ground potential GND as a low level into an output signal having the increased potential Vpp as a high level and a negative potential Vnb as a low level.

The circuit arrangements shown in FIGS. 8–11 are by way of example only, and any of various other level converters may be incorporated in each of the main row decoder 101 and the auxiliary row decoder 102.

Figure 13:
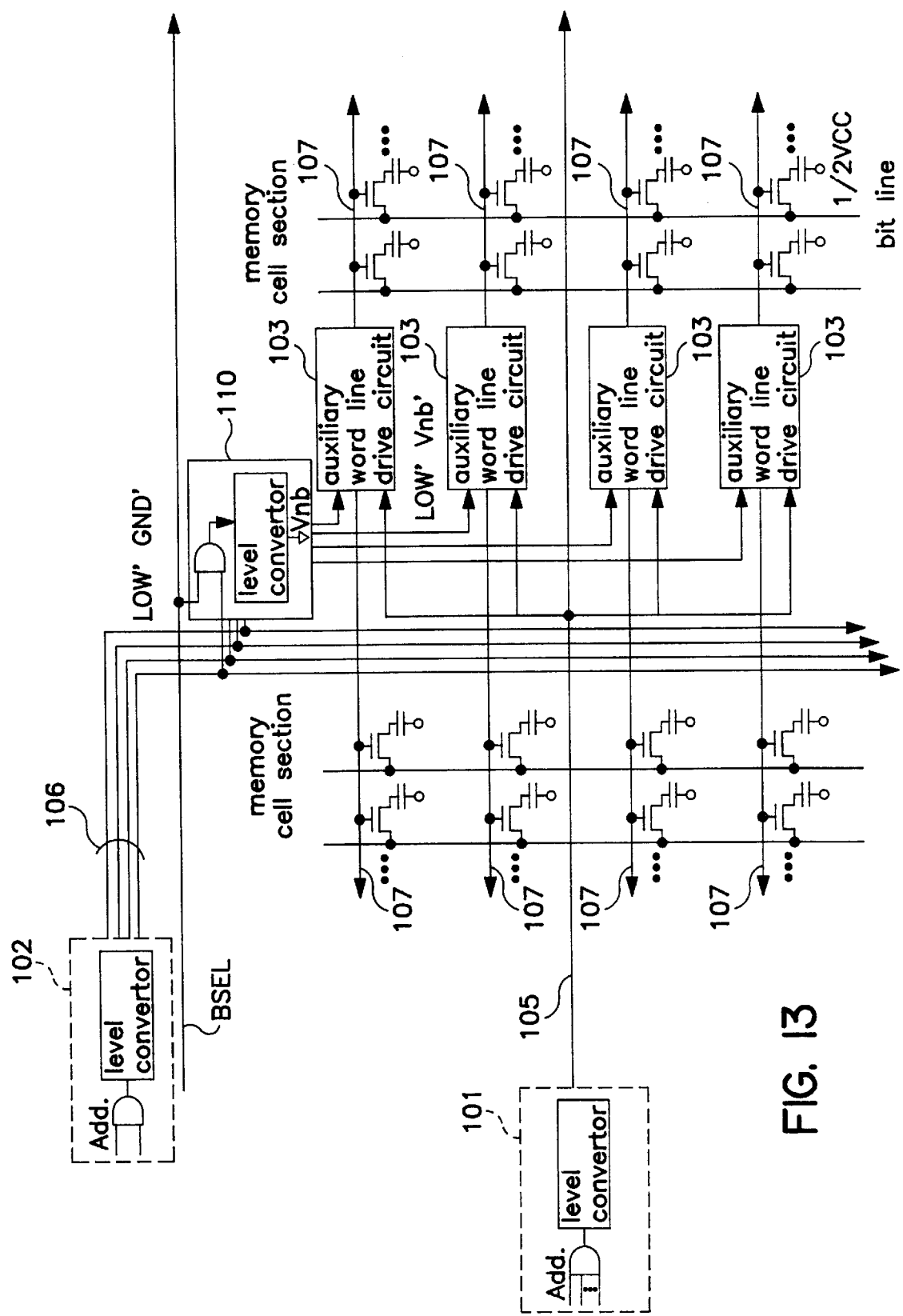
FIG. 13 is a circuit diagram, partly in block form, of a semiconductor memory device according to another embodiment of the present invention.

FIG. 13 shows, partly in block form, of a semiconductor memory device according to another embodiment of the present invention.

The semiconductor memory device shown in FIG. 13 is substantially the same as the semiconductor memory device shown in FIG. 7. In FIG. 13, however, a low-level logic output signal from an auxiliary row decoder 102 is of a ground potential GND. Level converters 110 disposed closely to auxiliary word line drive circuits 103 are activated by a logic operation between output signals from auxiliary row decoders 102 and a signal BSEL which selects a memory cell array. The level converters 110 convert the low-level logic output signal from the auxiliary row decoder 102 into a negative potential Vnb.

The level converters 110 are located in SWCROSS regions at points of intersection between auxiliary word line drive circuit array 109 and a sensing circuit array in the layout shown in FIG. 6. Only those level converters 110 which activate a memory cell array unit selected by a block selecting signal line BSEL running from the main row decoder 101 along the sensing circuit array are operated.

The connections shown in FIG. 13 are advantageous in that since the low-level logic output signal from the auxiliary row decoder 102 is of the ground potential GND, but not a negative potential, loads to charge and discharge the negative potential generator 104 with the auxiliary word selecting lines 106 can be reduced.

Figure 12:
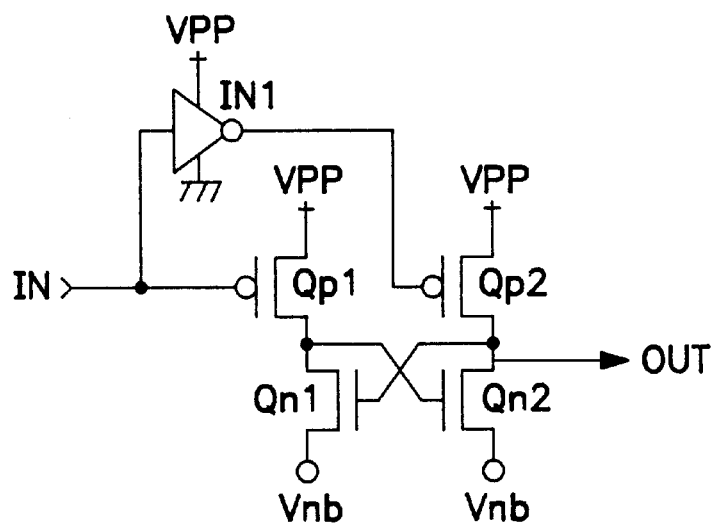

The main row decoder 101 has a level converter which may be of any of the circuit arrangements shown in FIGS. 8 through 11. The auxiliary row decoder 102 has a level converter which may be of the circuit arrangement shown in FIG. 8 which converts an input signal having a power supply potential Vcc as a high level and a ground potential GND as a low level into an output signal having an increased potential Vpp as a high level and a ground potential GND as a low level. Each of the level converters 110 may be of a circuit arrangement shown in FIGS. 9 or 12. Any of various other level converters may be incorporated in each of the main row decoder 101, the auxiliary row decoder 102, and the level converters 110 shown in FIG. 13.

Various examples of each of the auxiliary word line drive circuits 103 will be described below. Signals for control lines of the auxiliary word line drive circuits 103 are converted in level by the main row decoder 101 and the auxiliary row decoder 102, and then applied to the auxiliary word line drive circuits 103.

Figure 14A:
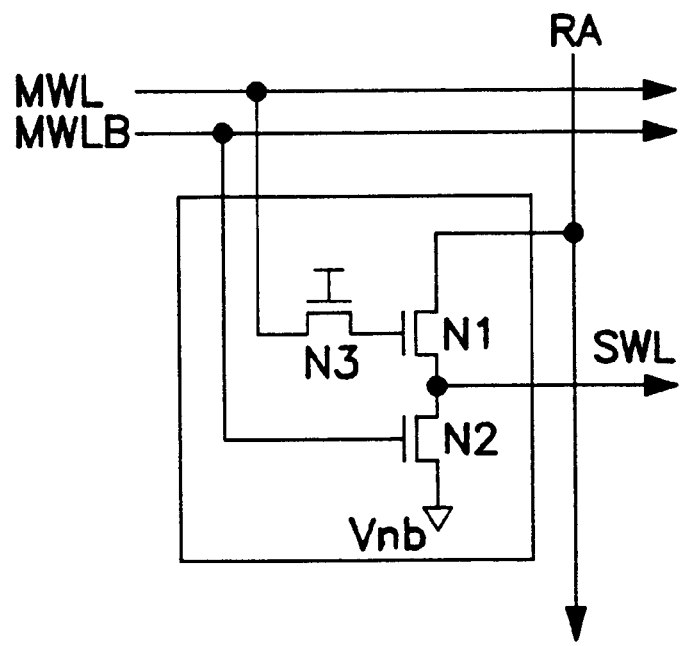
Figure 14B:
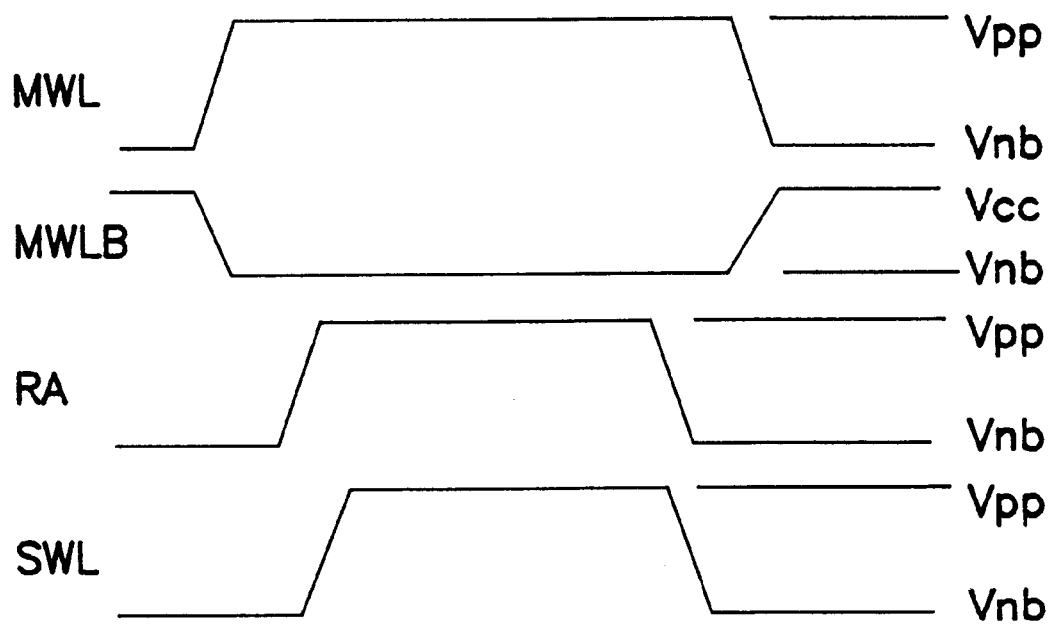

FIGS. 14A and 14B show a first example of each of the auxiliary word line drive circuits 103.

As shown in FIG. 14A, the auxiliary word line drive circuit 103 comprises three NMOS transistors N1, N2, N3. The transistor N1 is connected between an auxiliary word selecting line RA and an auxiliary word line SWL and has a gate to which a potential from a main word line MWL is applied. The transistor N2 is connected between a negative potential supply line and the auxiliary word line SWL and has a gate to which a complementary main word line MWLB is connected. The transistor N3 is connected between the main word line MWL and the gate of the transistor N1 and has a gate to which the power supply Vcc or the increased potential Vpp is applied.

In an unselected state, the main word line MWL is held at the negative potential Vnb, the complementary main word line MWLB at the power supply potential Vcc, and the auxiliary word selecting line RA at the negative potential Vnb. The transistor N2 is rendered conductive, keeping the auxiliary word line SWL at the negative potential Vnb.

The main word line MWL which is selected in response to the application of an address signal changes from the negative potential Vnb to the increased potential Vpp. The complementary main word line MWLB changes from the power supply potential Vcc to the negative potential Vnb. A potential level which is equal to the level of "the gate potential of the transistor N3–the threshold voltage of the transistor N3" is applied to the gate of the transistor N1. When the selected auxiliary word selecting line RA changes from the negative potential Vnb to the increased potential Vpp, the gate potential of the transistor N1 increases to a level in the vicinity of the level of "the gate potential of the transistor N3–the threshold voltage of the transistor N3 + Vpp – Vnb" due to a capacitive coupling, thus transferring the potential of the auxiliary word selecting line RA to the auxiliary word line SWL without a reduction in level.

After the memory cell is accessed, the auxiliary word selecting line RA changes from the increased potential Vpp to the negative potential Vnb, drawing the potential of the auxiliary word line SWL from the increased potential Vpp to the negative potential Vnb. The main word line MWL changes from the increased potential Vpp to the negative potential Vnb, and the complementary main word line MWLB changes from the negative potential Vnb to the power supply potential Vcc. The auxiliary word line drive circuit now returns to the unselected state.

Figure 15A:
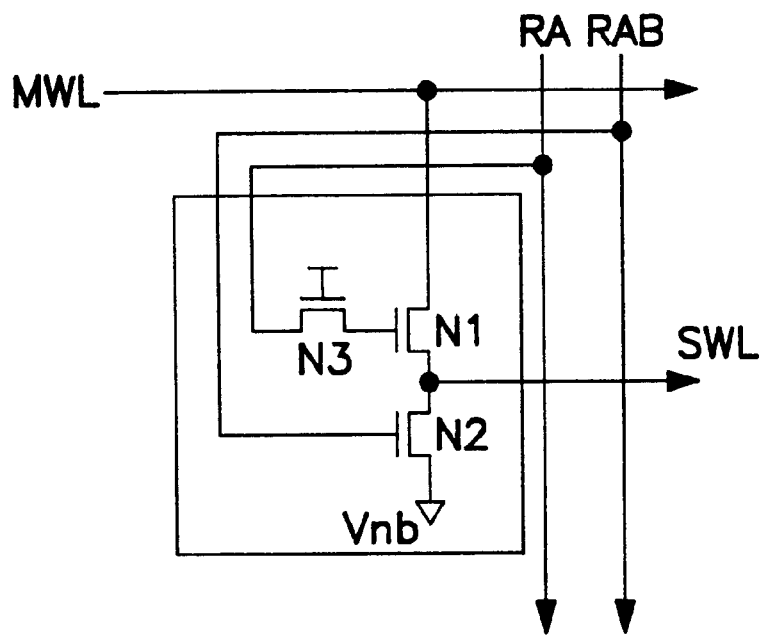
Figure 15B:
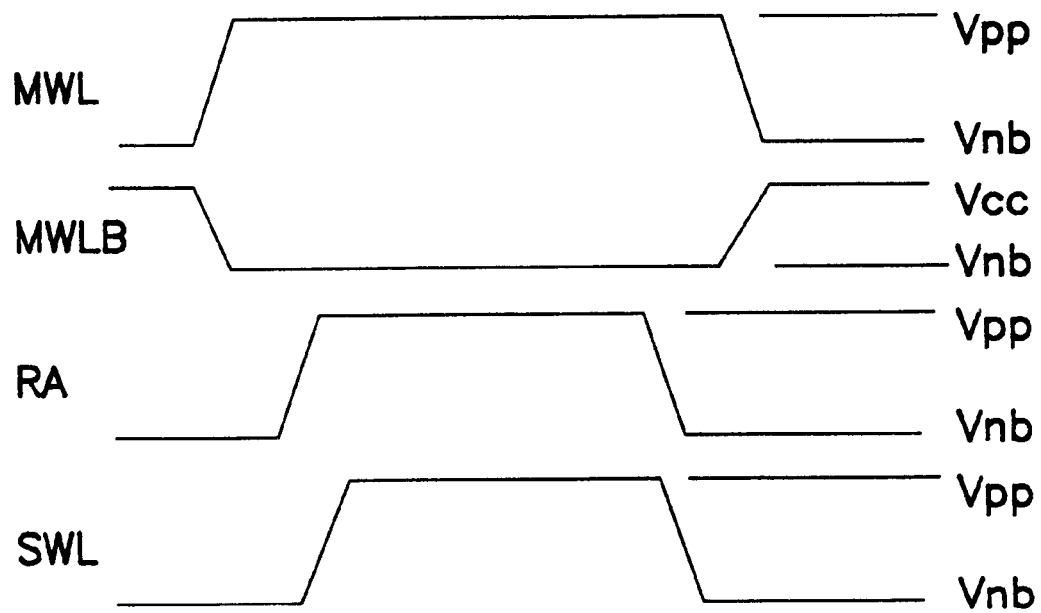

FIGS. 15A and 15B show a second example of each of the auxiliary word line drive circuits 103.

As shown in FIG. 15A, the auxiliary word line drive circuit 103 comprises three NMOS transistors N1, N2, N3. The transistor N1 is connected between a main word line MWL and an auxiliary word line SWL and has a gate to which a potential from an auxiliary word selecting line RA is applied. The transistor N2 is connected between a negative potential supply line and the auxiliary word line SWL and has a gate to which a complementary auxiliary word selecting line RAB is connected. The transistor N3 is connected between the auxiliary word selecting line RA and the gate of the transistor N1 and has a gate to which the power supply potential Vcc or the increased potential Vpp is applied.

In an unselected state, the auxiliary word selecting line RA is held at the negative potential Vnb, the complementary auxiliary word selecting line RAB at the power supply potential Vcc, and the main word line MWL at the negative potential Vnb. The transistor N2 is rendered conductive, keeping the auxiliary word line SWL at the negative potential Vnb.

The auxiliary word selecting line RA which is selected in response to the application of an address signal changes from the negative potential Vnb to the increased potential Vpp. The complementary auxiliary word selecting line RAB changes from the power supply potential Vcc to the negative potential Vnb. A potential level which is equal to the level of "the gate potential of the transistor N3–the threshold voltage of the transistor N3" is applied to the gate of the transistor N1. When the selected main word line MWL changes from the negative potential Vnb to the increased potential Vpp, the gate potential of the transistor N1 increases to a level in the vicinity of the level of "the gate potential of the transistor N3–the threshold voltage of the transistor N3 + Vpp − Vnb" due to a capacitive coupling, thus transferring the potential of the main word line MWL to the auxiliary word line SWL without a reduction in level.

After the memory cell is accessed, the main word line MWL changes from the increased potential Vpp to the negative potential Vnb, drawing the potential of the auxiliary word line SWL from the increased potential Vpp to the negative potential Vnb. The auxiliary word selecting line RA changes from the increased potential Vpp to the negative potential Vnb, and the complementary auxiliary word selecting line RAB changes from the negative potential Vnb to the power supply potential Vcc. The auxiliary word line drive circuit now returns to the unselected state.

Figure 16A:
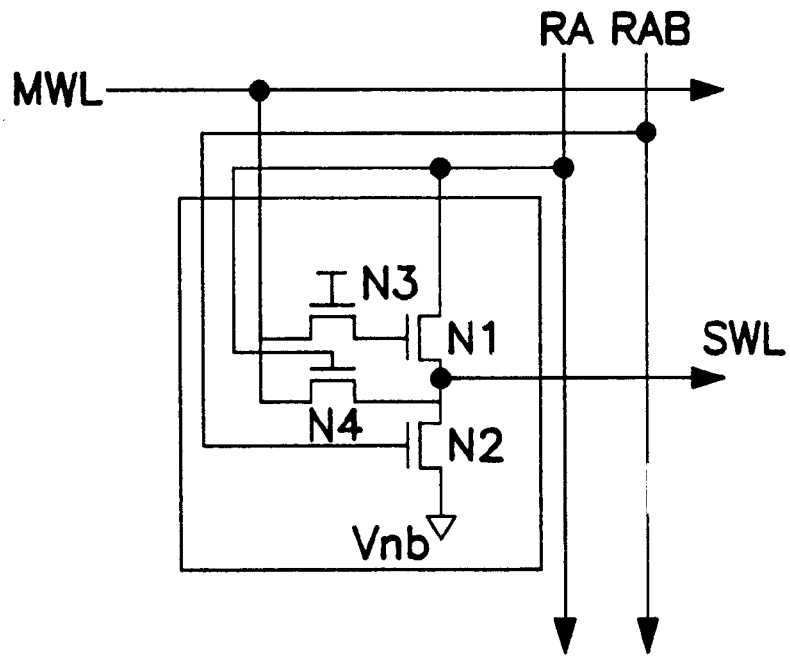
Figure 16B:
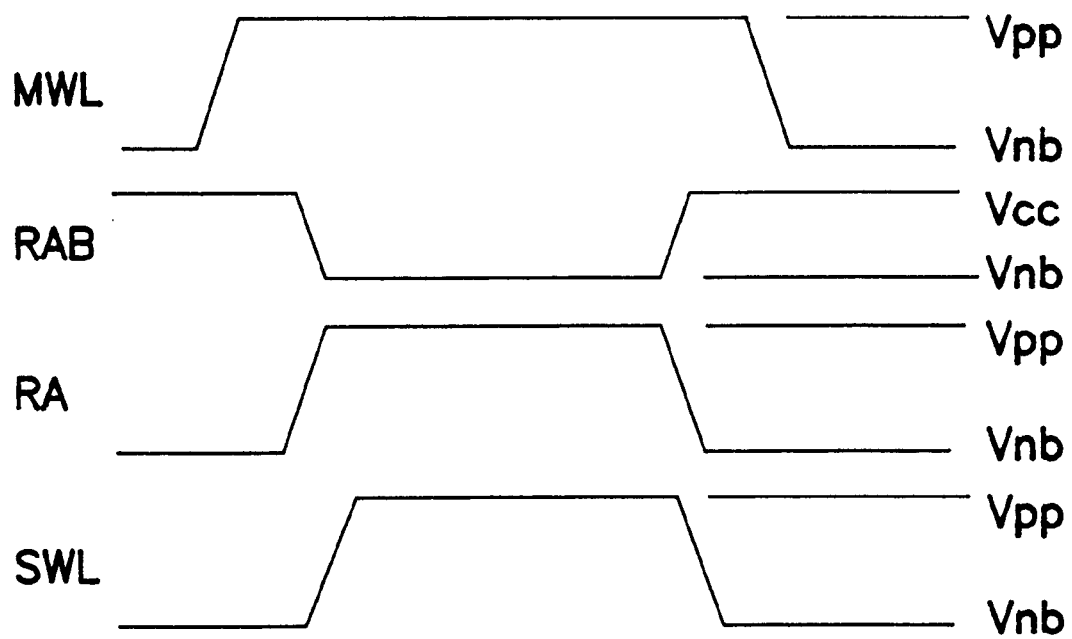

FIGS. 16A and 16B show a third example of each of the auxiliary word line drive circuits 103.

As shown in FIG. 16A, the auxiliary word line drive circuit 103 comprises four NMOS transistors N1, N2, N3, N4. The transistor N1 is connected between an auxiliary word selecting line RA and an auxiliary word line SWL and has a gate to which a potential from a main word line MWL is applied. The transistor N2 is connected between a negative potential supply line and the auxiliary word line SWL and has a gate to which a complementary auxiliary word selecting line RAB is connected. The transistor N3 is connected between the main word line MWL and the gate of the transistor N1 and has a gate to which the power supply potential Vcc or the increased potential Vpp is applied. The transistor N4 is connected between the main word line MWL and the auxiliary word line SWL and has a gate to which auxiliary word selecting line RA is connected.

In an unselected state, the auxiliary word selecting line RA is held at the negative potential Vnb, the complementary auxiliary word selecting line RAB at the power supply potential Vcc, and the main word line MWL at the negative potential Vnb. The transistor N2 is rendered conductive, keeping the auxiliary word line SWL at the negative potential Vnb.

The main word line MWL which is selected in response to the application of an address signal changes from the negative potential Vnb to the increased potential Vpp. A potential level which is equal to the level of "the gate potential of the transistor N3–the threshold voltage of the transistor N3" is applied to the gate of the transistor N1. When the selected auxiliary word selecting line RA changes from the negative potential Vnb to the increased potential Vpp, the gate potential of the transistor N1 increases to a level in the vicinity of the level of "the gate potential of the transistor N3–the threshold voltage of the transistor N3+Vpp−Vnb" due to a capacitive coupling, thus transferring the potential of the auxiliary word selecting line RA to the auxiliary word line SWL without a reduction in level. The transistor N4 connects the auxiliary word line SWL to the main word line MWL in order to prevent the auxiliary word line SWL from floating from the negative potential when the main word line MWL is at the negative potential Vnb and the auxiliary word selecting line RA is at the increased potential Vpp.

After the memory cell is accessed, the auxiliary word selecting line RA changes from the increased potential Vpp to the negative potential Vnb, and the complementary auxiliary word selecting line RAB changes from the negative potential Vnb to the power supply potential Vcc, drawing the potential of the auxiliary word line SWL from the increased potential Vpp to the negative potential Vnb. The main word line MWL changes from the increased potential Vpp to the negative potential Vnb. The auxiliary word line drive circuit now returns to the unselected state.

Figure 17A:
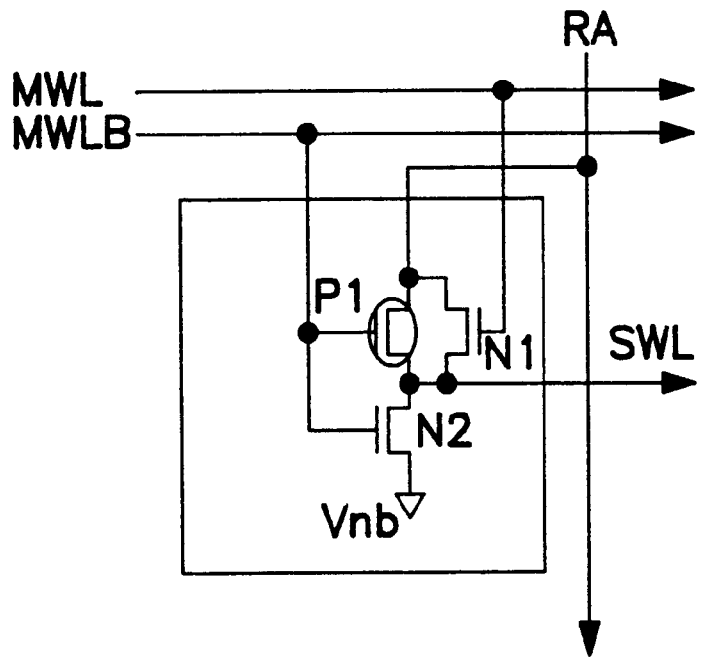
Figure 17B:
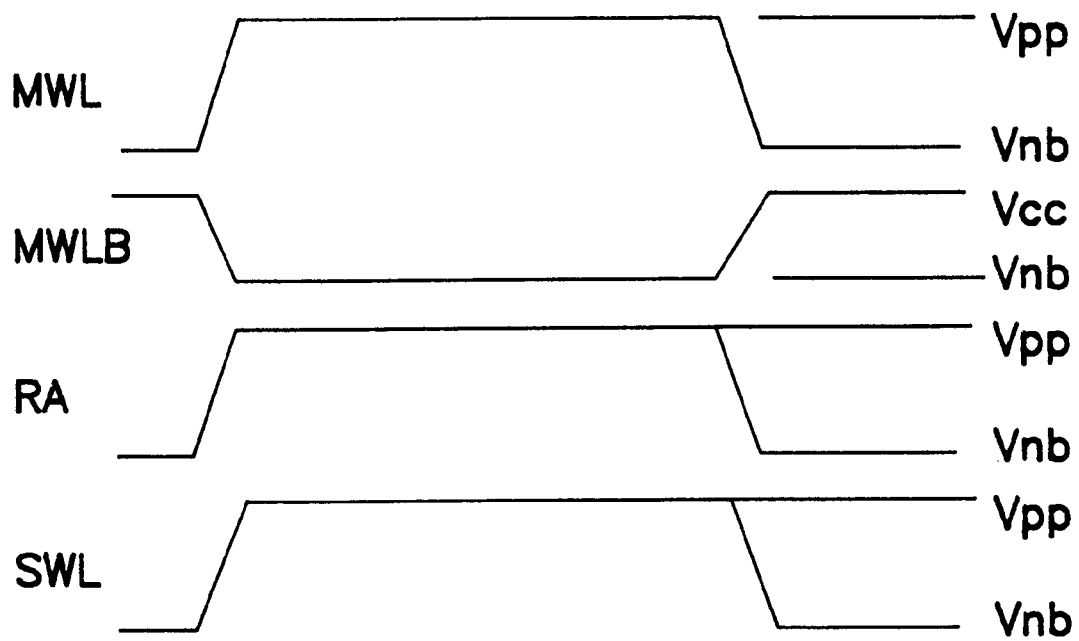

FIGS. 17A and 17B show a fourth example of each of the auxiliary word line drive circuits 103.

As shown in FIG. 17A, the auxiliary word line drive circuit 103 comprises a PMOS transistor P1 and NMOS transistors N1, N2. The NMOS transistor N1 is connected between an auxiliary word selecting line RA and an auxiliary word line SWL and has a gate to which a potential from a main word line MWL is applied. The NMOS transistor N2 is connected between a negative potential supply line and the auxiliary word line SWL and has a gate to which a complementary main word line MWLB is connected. The PMOS transistor P1 is connected between the auxiliary word selecting line RA and the auxiliary word line SWL and has a gate to which the complementary main word line MWLB is connected.

In an unselected state, the main word line MWL is held at the negative potential Vnb, the complementary main word line MWLB at the power supply potential Vcc, and the auxiliary word selecting line RA at the negative potential Vnb. The transistor N2 is rendered conductive, keeping the auxiliary word line SWL at the negative potential Vnb.

The main word line MWL which is selected in response to the application of an address signal changes from the negative potential Vnb to the increased potential Vpp. The complementary main word line MWLB changes from the power supply potential Vcc to the negative potential Vnb.

The transistor N1 is rendered conductive, connecting the auxiliary word selecting line RA and the auxiliary word line SWL to each other. When the selected auxiliary word selecting line RA changes from the negative potential Vnb to the increased potential Vpp, the transistor P1 is also rendered conductive, transferring the potential of the auxiliary word selecting line RA to the auxiliary word line SWL without a reduction in level.

After the memory cell is accessed, the auxiliary word selecting line RA changes from the increased potential Vpp to the negative potential Vnb, the main word line MWL changes from the increased potential Vpp to the negative potential Vnb, and the complementary main word line MWLB changes from the negative potential Vnb to the power supply potential Vcc, drawing the potential of the auxiliary word line SWL from the increased potential Vpp to the negative potential Vnb. The auxiliary word line drive circuit now returns to the unselected state.

Figure 18A:
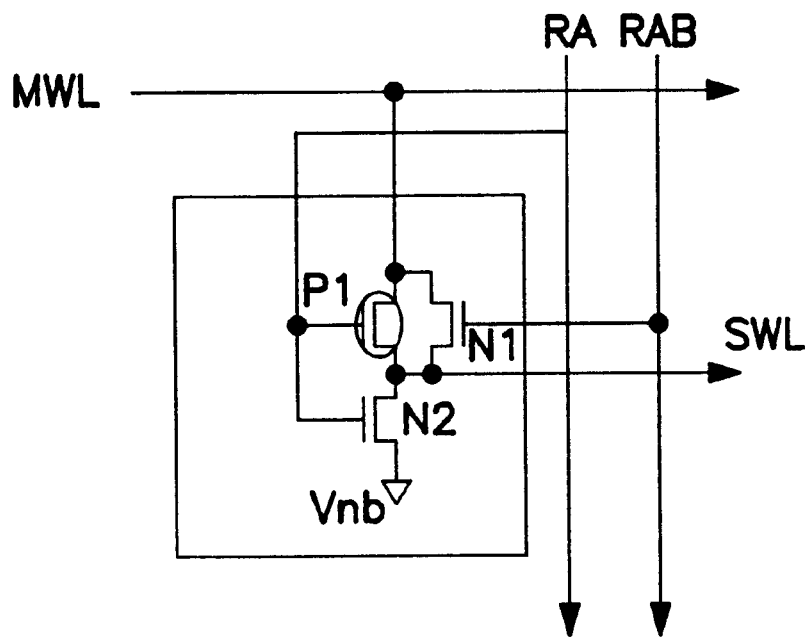
Figure 18B:
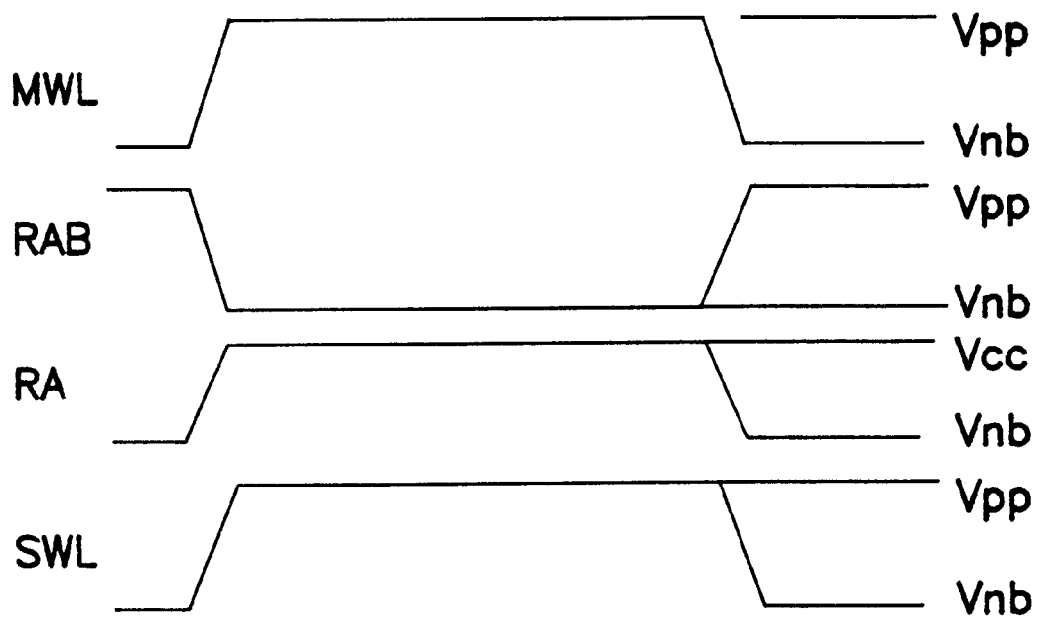

FIGS. 18A and 18B show a fifth example of each of the auxiliary word line drive circuits 103.

As shown in FIG. 18A, the auxiliary word line drive circuit 103 comprises a PMOS transistor P1 and NMOS transistors N1, N2. The NMOS transistor N1 is connected between a main word line MWL and an auxiliary word line SWL and has a gate to which a potential from an auxiliary word selecting line RA is applied. The NMOS transistor N2 is connected between a negative potential supply line and the auxiliary word line SWL and has a gate to which a complementary auxiliary word selecting line RAB is connected. The PMOS transistor P1 is connected between the main word line MWL and the auxiliary word line SWL and has a gate to which the complementary auxiliary word selecting line RAB is connected.

In an unselected state, the main word line MWL is held at the negative potential Vnb, the auxiliary word selecting line RA at the negative potential Vnb, and the complementary auxiliary word selecting line RAB at the power supply potential Vcc. The transistor N2 is rendered conductive, keeping the auxiliary word line SWL at the negative potential Vnb.

The auxiliary word selecting line RA which is selected in response to the application of an address signal changes from the negative potential Vnb to the increased potential Vpp. The complementary auxiliary word selecting line RAB changes from the power supply potential Vcc to the negative potential Vnb.

The transistor N1 is rendered conductive, connecting the main word line MWL and the auxiliary word line SWL to each other. When the selected main word line MWL changes from the negative potential Vnb to the increased potential Vpp, the transistor P1 is also rendered conductive, transferring the potential of the main word line MWL to the auxiliary word line SWL without a reduction in level.

After the memory cell is accessed, the main word line MWL changes from the increased potential Vpp to the negative potential Vnb, the auxiliary word selecting line RA changes from the increased potential Vpp to the negative potential Vnb, and the complementary auxiliary word selecting line RAB changes from the negative potential Vnb to the power supply potential Vcc, drawing the potential of the auxiliary word line SWL from the increased potential Vpp to the negative potential Vnb. The auxiliary word line drive circuit now returns to the unselected state.

Figure 19A:
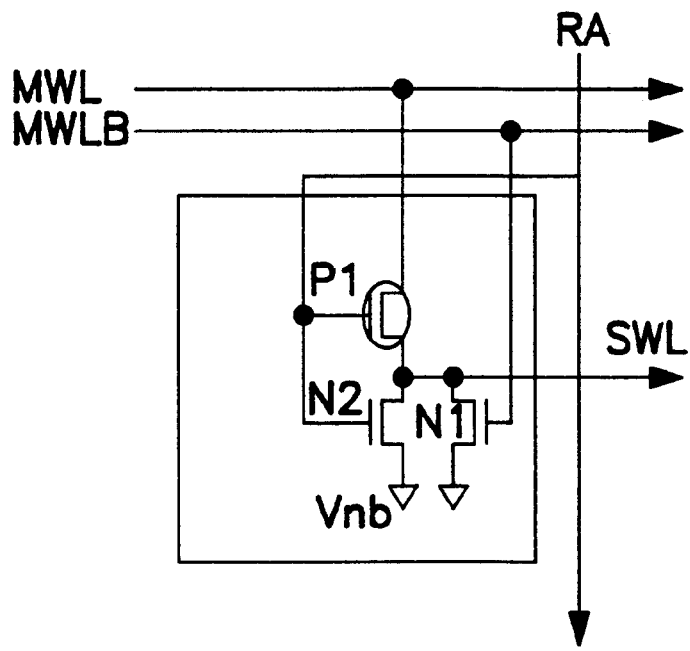
Figure 19B:
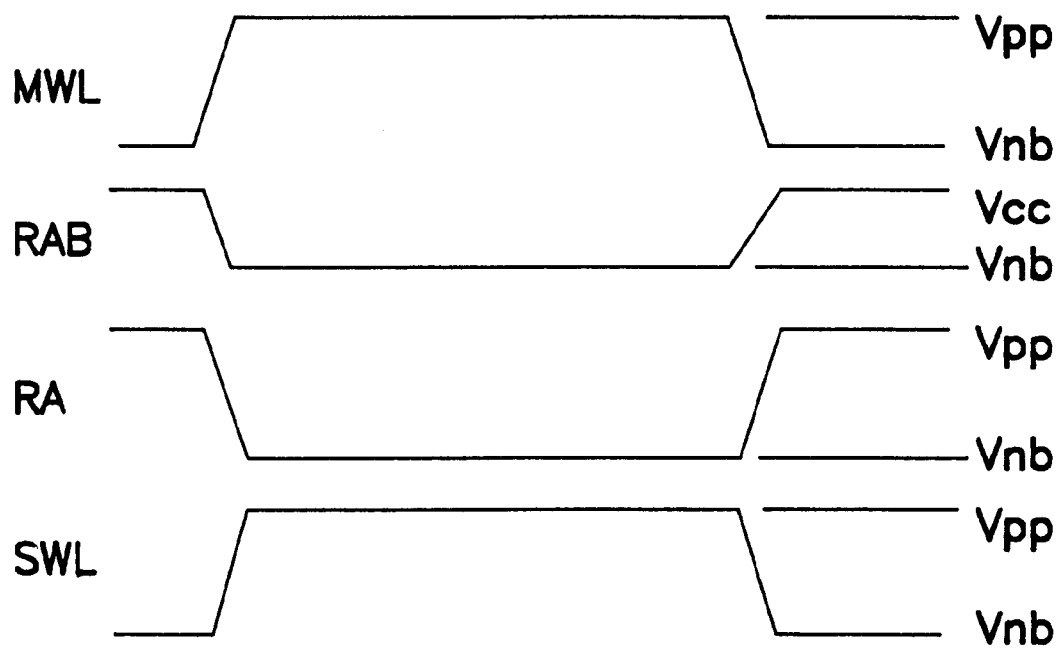

FIGS. 19A and 19B show a sixth example of each of the auxiliary word line drive circuits 103.

As shown in FIG. 19A, the auxiliary word line drive circuit 103 comprises a PMOS transistor P1 and NMOS transistors N1, N2. The NMOS transistor N1 is connected between a negative potential supply line and an auxiliary word line SWL and has a gate to which a potential from a complementary main word line MWLB is connected. The NMOS transistor N2 is connected between the negative potential supply line and the auxiliary word line SWL and has a gate to which an auxiliary word selecting line RA is connected. The PMOS transistor P1 is connected between a main word line MWL and the auxiliary word line SWL and has a gate to which the auxiliary word selecting line RA is connected.

In an unselected state, the main word line MWL is held at the negative potential Vnb, the complementary main word line MWLB at the power supply potential Vcc, and the auxiliary word selecting line RA at the increased potential Vpp. The transistors N1, N2 are rendered conductive, keeping the auxiliary word line SWL at the negative potential Vnb.

The auxiliary word selecting line RA which is selected in response to the application of an address signal changes from the increased potential Vpp to the negative potential Vnb, rendering the transistor N2 nonconductive. The selected complementary main word line MWLB changes from the power supply potential Vcc to the negative potential Vnb, rendering the transistor N1 nonconductive, so that the negative potential supply line and the auxiliary word line SWL are disconnected from each other. When the selected main word line MWL changes from the negative potential Vnb to the increased potential Vpp, the transistor P1 is rendered conductive, transferring the potential of the main word line MWL to the auxiliary word line SWL without a reduction in level.

After the memory cell is accessed, the main word line MWL changes from the increased potential Vpp to the negative potential Vnb, the complementary main word line MWLB changes from the negative potential Vnb to the power supply potential Vcc, and the auxiliary word selecting line RA changes from the negative potential Vnb to the increased potential Vpp, drawing the potential of the auxiliary word line SWL from the increased potential Vpp to the negative potential Vnb. The auxiliary word line drive circuit now returns to the unselected state.

Figure 20A:
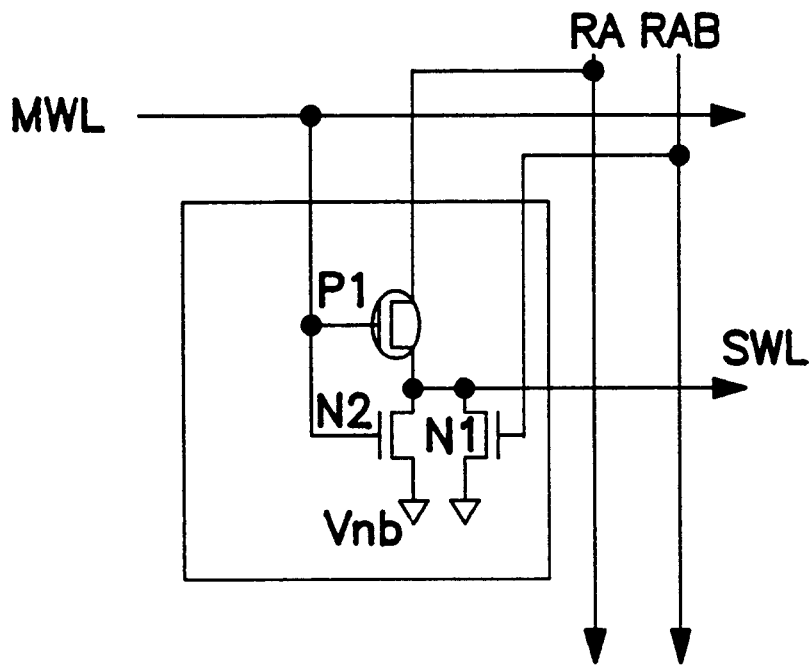
Figure 20B:
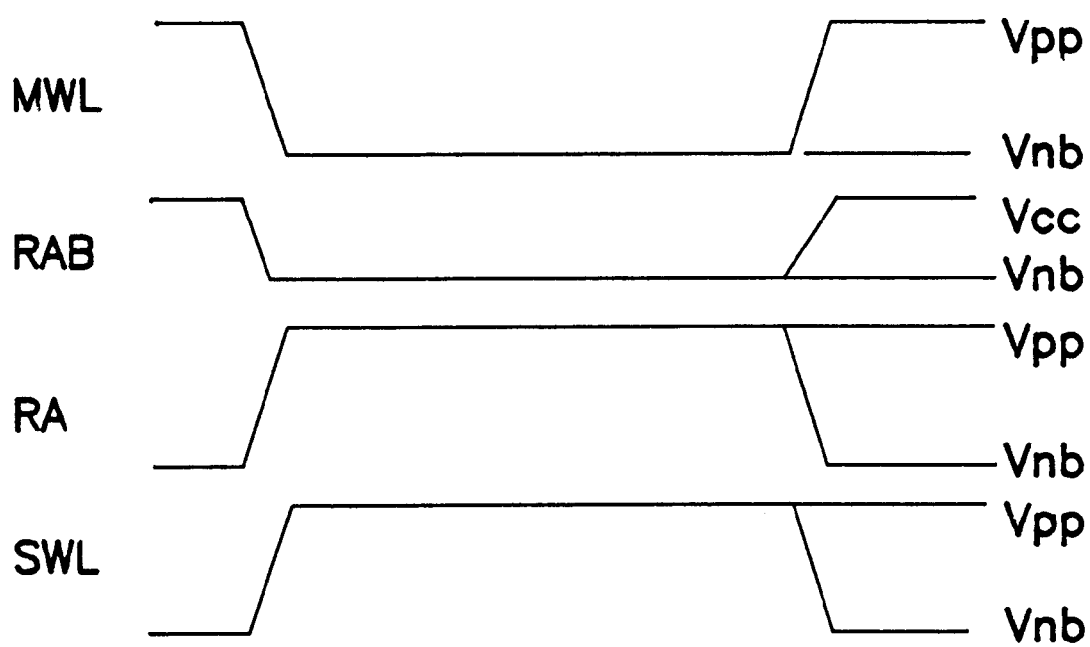

FIGS. 20A and 20B show a seventh example of each of the auxiliary word line drive circuits 103.

As shown in FIG. 20A, the auxiliary word line drive circuit 103 comprises a PMOS transistor P1 and NMOS transistors N1, N2. The NMOS transistor N1 is connected between a negative potential supply line and an auxiliary word line SWL and has a gate to which a potential from a complementary auxiliary word selecting line RAB is connected. The NMOS transistor N2 is connected between the negative potential supply line and the auxiliary word line SWL and has a gate to which a main word line MWL is connected. The PMOS transistor P1 is connected between an auxiliary word selecting line RA and the auxiliary word line SWL and has a gate to which the main word line MWL is connected.

In an unselected state, the main word line MWL is held at the increased potential Vpp, the auxiliary word selecting line RA at the negative potential Vnb, and the complementary auxiliary word selecting line RAB at the power supply potential Vcc. The transistors N1, N2 are rendered conductive, keeping the auxiliary word line SWL at the negative potential Vnb.

The main word line MWL which is selected in response to the application of an address signal changes from the increased potential Vpp to the negative potential Vnb, rendering the transistor N2 nonconductive. The selected complementary auxiliary word selecting line RAB changes from the power supply potential Vcc to the negative potential Vnb, rendering the transistor N1 nonconductive, so that the negative potential supply line and the auxiliary word line SWL are disconnected from each other. When the selected auxiliary word selecting line RA changes from the negative potential Vnb to the increased potential Vpp, the transistor P1 is rendered conductive, transferring the potential of the auxiliary word selecting line RA to the auxiliary word line SWL without a reduction in level.

After the memory cell is accessed, the auxiliary word selecting line RA changes from the increased potential Vpp to the negative potential Vnb, the complementary auxiliary word selecting line RAB changes from the negative potential Vnb to the power supply potential Vcc, and the main word line MWL changes from the negative potential Vnb to the increased potential Vpp, drawing the potential of the auxiliary word line SWL from the increased potential Vpp to the negative potential Vnb. The auxiliary word line drive circuit now returns to the unselected state.

Figure 21A:
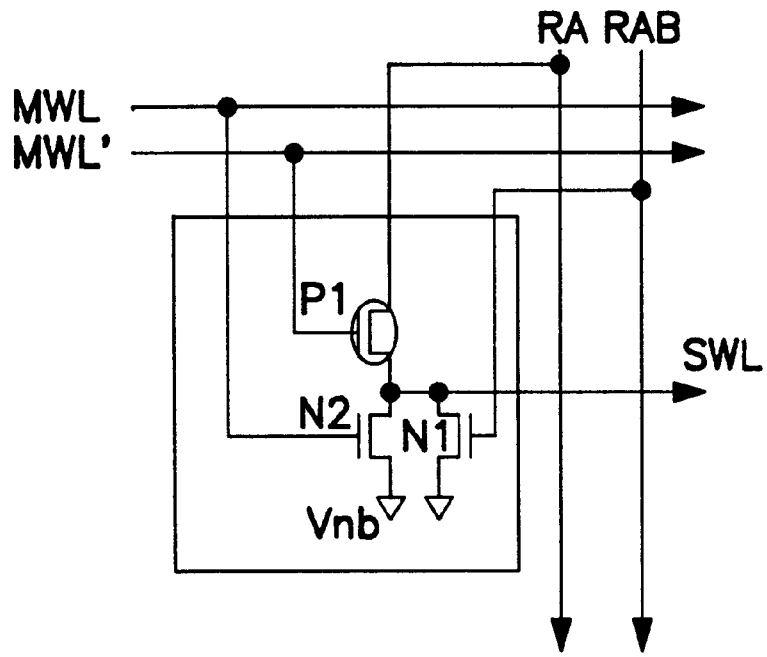
Figure 21B:
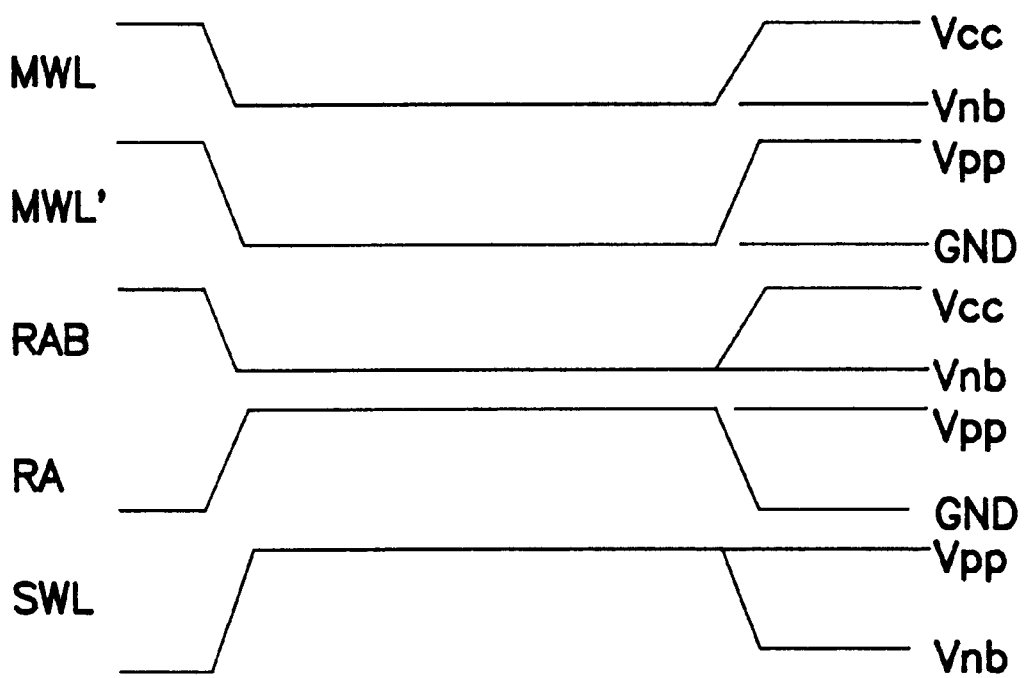

FIGS. 21A and 21B show an eighth example of each of the auxiliary word line drive circuits 103.

As shown in FIG. 21A, the auxiliary word line drive circuit 103 comprises a PMOS transistor P1 and NMOS transistors N1, N2. The NMOS transistor N1 is connected between a negative potential supply line and an auxiliary word line SWL and has a gate to which a potential from a complementary auxiliary word selecting line RAB is connected. The NMOS transistor N2 is connected between the negative potential supply line and the auxiliary word line SWL and has a gate to which a main word line MWL is connected. The PMOS transistor P1 is connected between an auxiliary word selecting line RA and the auxiliary word line SWL and has a gate to which an in-phase main word line MWL' is connected.

In an unselected state, the main word line MWL is held at the power supply potential Vcc, the in-phase main word line MWL' at the increased potential Vpp, the auxiliary word selecting line RA at the ground potential GND, and the complementary auxiliary word selecting line RAB at the power supply potential Vcc. The transistors N1, N2 are rendered conductive, keeping the auxiliary word line SWL at the negative potential Vnb.

The main word line MWL which is selected in response to the application of an address signal changes from the power supply potential Vcc to the negative potential Vnb, and the in-phase main word line MWL' changes from the increased potential Vpp to the ground potential GND, rendering the transistor N2 nonconductive. The selected complementary auxiliary word selecting line RAB changes from the power supply potential Vcc to the negative potential Vnb, rendering the transistor N1 nonconductive, so that the negative potential supply line and the auxiliary word line SWL are disconnected from each other. When the selected auxiliary word selecting line RA changes from the ground potential GND to the increased potential Vpp, the transistor P1 is rendered conductive, transferring the potential of the auxiliary word selecting line RA to the auxiliary word line SWL without a reduction in level.

After the memory cell is accessed, the auxiliary word selecting line RA changes from the increased potential Vpp to the ground potential GND, the complementary auxiliary word selecting line RAB changes from the negative potential Vnb to the power supply potential Vcc, the main word line MWL changes from the negative potential Vnb to the power supply potential Vcc, and the in-phase main word line MWL' changes from the ground potential GND to the increased potential Vpp, drawing the potential of the auxiliary word line SWL from the increased potential Vpp to the negative potential Vnb. The auxiliary word line drive circuit now returns to the unselected state.

The circuit arrangement shown in FIGS. 21A and 21B is advantageous in that since the low level of the auxiliary word selecting line RA is held at the ground potential GND, but not the negative potential, the loads to charge and discharge in the negative potential generator 104 or the increased potential generator can be reduced.

If the auxiliary word line drive circuits 103 employ the increased potential Vpp and the negative potential Vnb, then the maximum voltage applied to an oxide film is Vpp – Vnb. For lessening the voltage applied to the oxide film, the logic voltage level on each control line may be changed by a level converter.

Figure 22A:
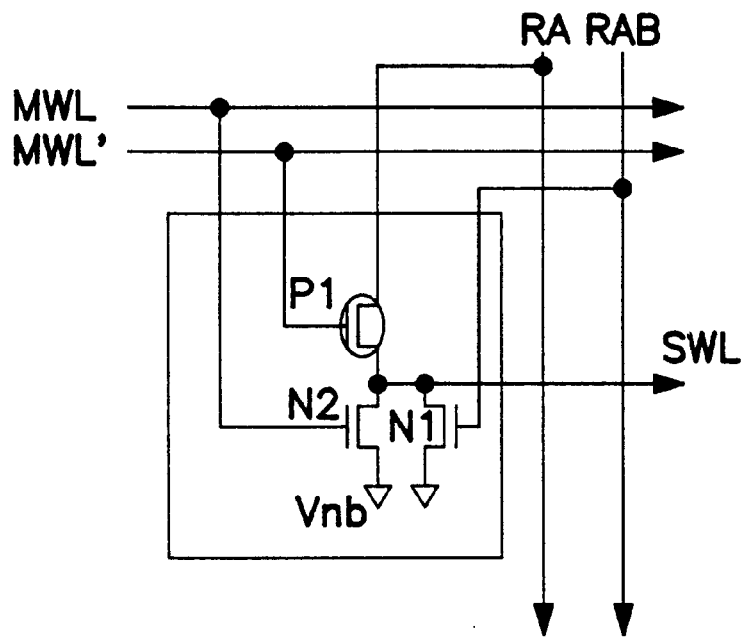
Figure 22B:
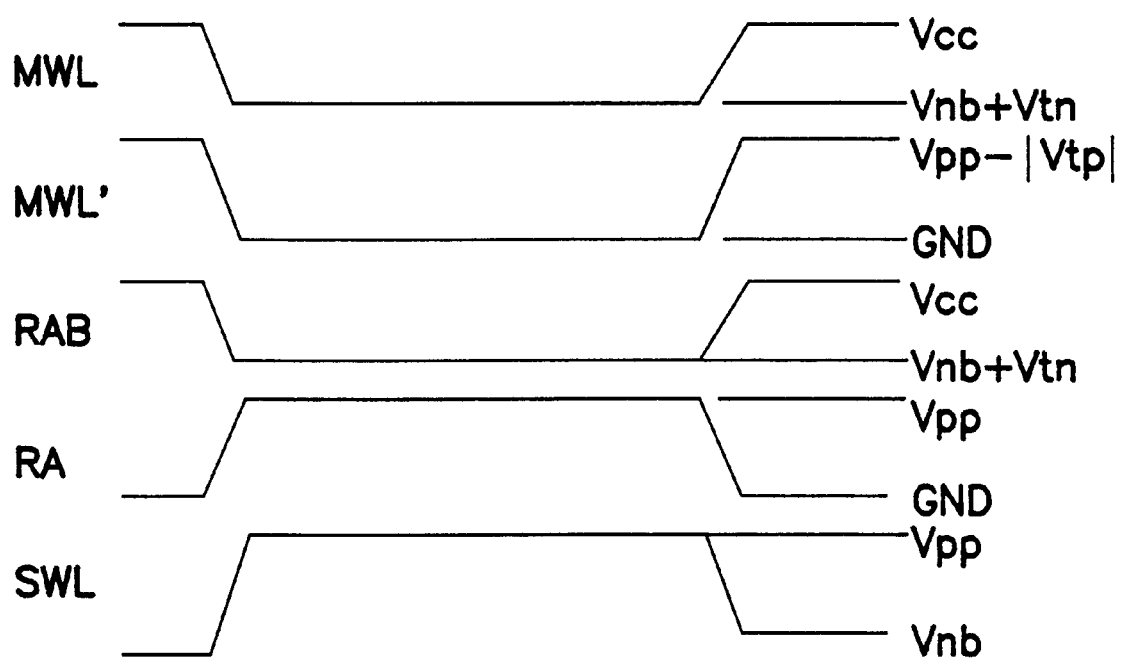

FIGS. 22A and 22B show a ninth example of each of the auxiliary word line drive circuits 103, as a circuit arrangement for lessening the voltage applied to the oxide film.

The auxiliary word line drive circuit 103 shown in FIG. 22A is identical in circuit arrangement and operation to the auxiliary word line drive circuit 103 shown in FIG. 21A. However, the logic levels for control lines are different. For example, the low level for the main word line and the complementary auxiliary word line is selected to be of a potential equal to or lower than the level of "the negative potential Vnb + the threshold voltage Vtn of the n-channel transistors", and is set to a low level higher than the negative potential Vnb. The level for the complementary main word line is selected to be of a potential equal to or higher than the level of "the increased potential Vpp – the absolute value |Vtp| of the threshold voltage of the p-channel transistor", and is set to a high level lower than the increased potential Vpp. With these settings, the maximum voltage applied to the oxide film is of a value in the vicinity of Vpp – Vnb – Vtn or Vpp – Vnb – |Vtp|, so that the voltage applied to the oxide film can be reduced. The logic levels for control lines can easily be changed by level converters if circuits for generating the respective potentials are provided.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:

a main row decoder activatable in response to an internal address signal, for activating a main word line;

an auxiliary row decoder activatable in response to an internal address signal, for selecting an auxiliary word selecting line corresponding to the internal address signal, out of a plurality of auxiliary word selecting lines;

auxiliary word line drive circuits associated respectively with auxiliary word lines connected to memory cell transistors in a memory cell array and the auxiliary word selecting lines, for activating a corresponding one of the auxiliary word lines when one of the main word line is activated and a corresponding one of the auxiliary word selecting lines is selected, and for holding a corresponding one of the auxiliary word lines at a negative potential when a corresponding one of the auxiliary word selecting lines is unselected; and a negative potential generator for supplying a negative potential to said main row decoder, said auxiliary row decoder, and said auxiliary word line drive circuits.

2. A semiconductor memory device according to claim 1, further comprising a plurality of level converters disposed remotely from said auxiliary row decoder, wherein said auxiliary word selecting lines extend from said auxiliary row decoder and are connected respectively to said auxiliary word line drive circuits through said level converters, respectively.

3. A semiconductor memory device according to claim 1, wherein when said main word line is at a high level and said auxiliary word selecting lines are at a high level, said auxiliary word lines are selected and held at a potential as a high level, wherein when said main word line is at a high level and said auxiliary word selecting lines are at a low level, said auxiliary word lines are unselected and held at a negative potential as a low level, wherein said main word line is at a low level and said auxiliary word selecting lines are at a high level, said auxiliary word lines are unselected and held at a negative potential as a low level, and wherein said main word line is at a low level and said auxiliary word selecting lines are at a low level, said auxiliary word lines are unselected and held at a negative potential as a low level.

4. A semiconductor memory device according to claim 2, wherein when said main word line is at a high level and said auxiliary word selecting lines are at a high level, said auxiliary word lines are selected and held at a potential as a high level, wherein when said main word line is at a high level and said auxiliary word selecting lines are at a low level, said auxiliary word lines are unselected and held at a negative potential as a low level, wherein said main word line is at a low level and said auxiliary word selecting lines are at a high level, said auxiliary word lines are unselected and held at a negative potential as a low level, and wherein said main word line is at a low level and said auxiliary word selecting lines are at a low level, said auxiliary word lines are unselected and held at a negative potential as a low level.

5. A semiconductor memory device according to claim 1, wherein when said main word line is at a high level and said auxiliary word selecting lines are at a low level, said auxiliary word lines are selected and held at a potential as a high level, wherein when said main word line is at a high level and said auxiliary word selecting lines are at a high level, said auxiliary word lines are unselected and held at a negative potential as a low level, wherein said main word line is at a low level and said auxiliary word selecting lines are at a high level, said auxiliary word lines are unselected and held at a negative potential as a low level, and wherein said main word line is at a low level and said auxiliary word selecting lines are at a low level, said auxiliary word lines are unselected and held at a negative potential as a low level.

6. A semiconductor memory device according to claim 2, wherein when said main word line is at a high level and said auxiliary word selecting lines are at a low level, said auxiliary word lines are selected and held at a potential as a high level, wherein when said main word line is at a high level and said auxiliary word selecting lines are at a high level, said auxiliary word lines are unselected and held at a negative potential as a low level, wherein said main word line is at a low level and said auxiliary word selecting lines are at a high level, said auxiliary word lines are unselected and held at a negative potential as a low level, and wherein said main word line is at a low level and said auxiliary word selecting lines are at a low level, said auxiliary word lines are unselected and held at a negative potential as a low level.

7. A semiconductor memory device according to claim 1, wherein when said main word line is at a low level and said auxiliary word selecting lines are at a high level, said auxiliary word lines are selected and held at a potential as a high level, wherein when said main word line is at a high level and said auxiliary word selecting lines are at a high level, said auxiliary word lines are unselected and held at a negative potential as a low level, wherein said main word line is at a high level and said auxiliary word selecting lines are at a low level, said auxiliary word lines are unselected and held at a negative potential as a low level, and wherein said main word line is at a low level and said auxiliary word selecting lines are at a low level, said auxiliary word lines are unselected and held at a negative potential as a low level.

8. A semiconductor memory device according to claim 2, wherein when said main word line is at a low level and said auxiliary word selecting lines are at a high level, said auxiliary word lines are selected and held at a potential as a high level, wherein when said main word line is at a high level and said auxiliary word selecting lines are at a high level, said auxiliary word lines are unselected and held at a negative potential as a low level, wherein said main word line is at a high level and said auxiliary word selecting lines are at a low level, said auxiliary word lines are unselected and held at a negative potential as a low level, and wherein said main word line is at a low level and said auxiliary word selecting lines are at a low level, said auxiliary word lines are unselected and held at a negative potential as a low level.

9. A semiconductor memory device according to claim 3, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

10. A semiconductor memory device according to claim 4, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

11. A semiconductor memory device according to claim 5, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

12. A semiconductor memory device according to claim 6, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

13. A semiconductor memory device according to claim 7, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

14. A semiconductor memory device according to claim 8, wherein said high level of said main word line is controlled at a potential level equal to or higher than a power supply potential, said low level of said main word line is controlled at a potential level equal to or lower than a ground potential, said high level of said auxiliary word selecting lines is controlled at a potential level equal to or higher than a power supply potential, and said low level of said auxiliary word selecting lines is controlled at a potential level equal to or lower than a ground potential, and wherein said high level of said auxiliary word lines comprises a potential level equal to or higher than a power supply potential, and said low level of said auxiliary word lines comprises a negative potential.

15. A semiconductor memory device according to claim 3, wherein each of said auxiliary word line drive circuits comprises an N-channel first MOSFET connected between one of said auxiliary word selecting lines and one of said auxiliary word lines and having a gate for being supplied with a potential of said main word line, an N-channel second MOSFET connected between said negative potential generator and said one of said auxiliary word lines and having a gate for being supplied with a complementary signal of said main word line, and an N-channel third MOSFET connected between said main word line and said first MOSFET and having a gate for being supplied with a power supply potential or an increased potential higher than the power supply potential.

16. A semiconductor memory device according to claim 4, wherein each of said auxiliary word line drive circuits comprises an N-channel first MOSFET connected between one of said auxiliary word selecting lines and one of said auxiliary word lines and having a gate for being supplied with a potential of said main word line, an N-channel second MOSFET connected between said negative potential generator and said one of said auxiliary word lines and having a gate for being supplied with a complementary signal of said main word line, and an N-channel third MOSFET connected between said main word line and said first MOSFET and having a gate for being supplied with a power supply potential or an increased potential higher than the power supply potential.

17. A semiconductor memory device according to claim 3, wherein each of said auxiliary word line drive circuits comprises an N-channel first MOSFET connected between said main word line and one of said auxiliary word lines and having a gate for being supplied with a potential of one of said auxiliary word selecting lines, an N-channel second MOSFET connected between said negative potential generator and said one of said auxiliary word lines and having a gate for being supplied with a complementary signal of said one of said auxiliary word selecting lines, and an N-channel third MOSFET connected between said one of said auxiliary word selecting lines and said first MOSFET and having a gate for being supplied with a power supply potential or an increased potential higher than the power supply potential.

18. A semiconductor memory device according to claim 4, wherein each of said auxiliary word line drive circuits comprises an N-channel first MOSFET connected between said main word line and one of said auxiliary word lines and having a gate for being supplied with a potential of one of said auxiliary word selecting lines, an N-channel second MOSFET connected between said negative potential generator and said one of said auxiliary word lines and having a gate for being supplied with a complementary signal of said one of said auxiliary word selecting lines, and an N-channel third MOSFET connected between said one of said auxiliary word selecting lines and said first MOSFET and having a gate for being supplied with a power supply potential or an increased potential higher than the power supply potential.

19. A semiconductor memory device according to claim 3, wherein each of said auxiliary word line drive circuits comprises an N-channel first MOSFET connected between one of said auxiliary word selecting lines and one of said auxiliary word lines and having a gate for being supplied with a potential of said main word line, an N-channel second MOSFET connected between said negative potential generator and said one of said auxiliary word lines and having a gate for being supplied with a complementary signal of said one of said auxiliary word selecting lines, an N-channel third MOSFET connected between said main word line and said first MOSFET and having a gate for being supplied with a power supply potential or an increased potential higher than the power supply potential, and an N-channel fourth MOSFET connected between said main word line and said one of said auxiliary word lines and having a gate for being supplied with a signal of said one of said auxiliary word selecting lines.

20. A semiconductor memory device according to claim 4, wherein each of said auxiliary word line drive circuits comprises an N-channel first MOSFET connected between one of said auxiliary word selecting lines and one of said auxiliary word lines and having a gate for being supplied with a potential of said main word line, an N-channel second MOSFET connected between said negative potential generator and said one of said auxiliary word lines and having a gate for being supplied with a complementary signal of said one of said auxiliary word selecting lines, an N-channel third MOSFET connected between said main word line and said first MOSFET and having a gate for being supplied with a power supply potential or an increased potential higher than the power supply potential, and an N-channel fourth MOSFET connected between said main word line and said one of said auxiliary word lines and having a gate for being supplied with a signal of said one of said auxiliary word selecting lines.

21. A semiconductor memory device according to claim 3, wherein each of said auxiliary word line drive circuits comprises a P-channel first MOSFET connected between one of said auxiliary word selecting lines and one of said auxiliary word lines and having a gate for being supplied with a complementary signal of said main word line, an N-channel second MOSFET connected between said one of said auxiliary word selecting lines and said one of said auxiliary word lines and having a gate for being supplied with a signal of said main word line, and an N-channel third MOSFET connected between said one of said auxiliary word lines and said negative potential generator and having a gate for being supplied with a complementary signal of said main word line.

22. A semiconductor memory device according to claim 4, wherein each of said auxiliary word line drive circuits comprises a P-channel first MOSFET connected between one of said auxiliary word selecting lines and one of said auxiliary word lines and having a gate for being supplied with a complementary signal of said main word line, an N-channel second MOSFET connected between said one of said auxiliary word selecting lines and said one of said auxiliary word lines and having a gate for being supplied with a signal of said main word line, and an N-channel third MOSFET connected between said one of said auxiliary word lines and said negative potential generator and having a gate for being supplied with a complementary signal of said main word line.

23. A semiconductor memory device according to claim 3, wherein each of said auxiliary word line drive circuits comprises a P-channel first MOSFET connected between said main word line and one of said auxiliary word lines and having a gate for being supplied with a complementary signal of said one of said auxiliary word selecting lines, an N-channel second MOSFET connected between said main word line and said one of said auxiliary word lines and having a gate for being supplied with a signal of said one of said auxiliary word selecting lines, and an N-channel third MOSFET connected between said one of said auxiliary word lines and said negative potential generator and having a gate for being supplied with a complementary signal of said one of said auxiliary word selecting lines.

24. A semiconductor memory device according to claim 4, wherein each of said auxiliary word line drive circuits comprises a P-channel first MOSFET connected between said word line and one of said auxiliary word lines and having a gate for being supplied with a complementary signal of said one of said auxiliary word selecting lines, an N-channel second MOSFET connected between said main word line and said one of said auxiliary word lines and having a gate for being supplied with a signal of said one of said auxiliary word selecting lines, and an N-channel third MOSFET connected between said one of said auxiliary word lines and said negative potential generator and having a gate for being supplied with a complementary signal of said one of said auxiliary word selecting lines.

25. A semiconductor memory device according to claim 5, wherein each of said auxiliary word line drive circuits comprises a P-channel first MOSFET connected between said main word line and one of said auxiliary word lines and having a gate for being supplied with a signal of one of said auxiliary word selecting lines, an N-channel second MOSFET connected between said negative potential generator and said one of said auxiliary word lines and having a gate for being supplied with a complementary signal of said main word line, and an N-channel third MOSFET connected between said one of said auxiliary word lines and said negative potential generator and having a gate for being supplied with a signal of said one of said auxiliary word selecting lines.

26. A semiconductor memory device according to claim 6, wherein each of said auxiliary word line drive circuits comprises a P-channel first MOSFET connected between said main word line and one of said auxiliary word lines and having a gate for being supplied with a signal of one of said auxiliary word selecting lines, an N-channel second MOSFET connected between said negative potential generator and said one of said auxiliary word lines and having a gate for being supplied with a complementary signal of said main word line, and an N-channel third MOSFET connected between said one of said auxiliary word lines and said negative potential generator and having a gate for being supplied with a signal of said one of said auxiliary word selecting lines.

27. A semiconductor memory device according to claim 7, wherein each of said auxiliary word line drive circuits comprises a P-channel first MOSFET connected between one of said auxiliary word selecting lines and one of said auxiliary word lines and having a gate for being supplied with a signal of said main word line, an N-channel second MOSFET connected between said negative potential generator and said one of said auxiliary word lines and having a gate for being supplied with a signal of said main word line, and an N-channel third MOSFET connected between said one of said auxiliary word lines and said negative potential generator and having a gate for being supplied with a complementary signal of said one of said auxiliary word selecting lines.

28. A semiconductor memory device according to claim 8, wherein each of said auxiliary word line drive circuits comprises a P-channel first MOSFET connected between one of said auxiliary word selecting lines and one of said auxiliary word lines and having a gate for being supplied with a signal of said main word line, an N-channel second MOSFET connected between said negative potential generator and said one of said auxiliary word lines and having a gate for being supplied with a signal of said main word line, and an N-channel third MOSFET connected between said one of said auxiliary word lines and said negative potential generator and having a gate for being supplied with a complementary signal of said one of said auxiliary word selecting lines.

29. A semiconductor memory device according to claim 7, wherein each of said auxiliary word line drive circuits comprises a P-channel first MOSFET connected between one of said auxiliary word selecting lines and one of said auxiliary word lines and having a gate for being supplied with a signal of said main word line, an N-channel second MOSFET connected between said negative potential generator and said one of said auxiliary word lines and having a gate for being supplied with an in-phase signal of said main word line, and an N-channel third MOSFET connected between said one of said auxiliary word lines and said negative potential generator and having a gate for being supplied with a complementary signal of said one of said auxiliary word selecting lines.

30. A semiconductor memory device according to claim 8, wherein each of said auxiliary word line drive circuits comprises a P-channel first MOSFET connected between one of said auxiliary word selecting lines and one of said auxiliary word lines and having a gate for being supplied with a signal of said main word line, an N-channel second MOSFET connected between said negative potential generator and said one of said auxiliary word lines and having a gate for being supplied with an in-phase signal of said main word line, and an N-channel third MOSFET connected between said one of said auxiliary word lines and said negative potential generator and having a gate for being supplied with a complementary signal of said one of said auxiliary word selecting lines.

* * * * *